United States Patent [19]

Kajimoto et al.

[11] Patent Number: 5,084,838
[45] Date of Patent: Jan. 28, 1992

[54] LARGE-SCALE INTEGRATED CIRCUIT DEVICE SUCH AS A WAFER SCALE MEMORY HAVING IMPROVED ARRANGEMENTS FOR BYPASSING, REDUNDANCY, AND UNIT INTEGRATED CIRCUIT INTERCONNECTION

[75] Inventors: Takeshi Kajimoto, Nishitama; Mitsuteru Kobayashi, Hannou, both of Japan

[73] Assignee: Hitachi, Ltd., Tokyo, Japan

[21] Appl. No.: 391,783

[22] Filed: Aug. 9, 1989

[30] Foreign Application Priority Data

Aug. 12, 1988 [JP] Japan .................. 63-201295
Aug. 12, 1988 [JP] Japan .................. 63-201467
Aug. 12, 1988 [JP] Japan .................. 63-201468

[51] Int. Cl.$^5$ .......................... G11C 5/12; G11C 5/02
[52] U.S. Cl. .................................. 365/63; 365/51; 365/174; 365/200
[58] Field of Search ............. 365/230.03, 200, 63, 365/51, 174; 371/10.2

[56] References Cited

U.S. PATENT DOCUMENTS 4,791,607 12/1988 Igarashi et al. .................. 365/63 X

FOREIGN PATENT DOCUMENTS 1377859 12/1974 United Kingdom.
1525048 9/1976 United Kingdom.
2174518 11/1986 United Kingdom.
2177825 1/1987 United Kingdom.
2178204 2/1987 United Kingdom.

OTHER PUBLICATIONS

IEEE Proceedings, vol. 74, No. 12, Dec. 1986, "Future Trends in Water Scale Integration", by Carlson et al.
Article—Electronics and Power, Apr. 1986, pp. 283-285, "Brighter Prospects for Water-Scale Integration", by Dettmer.

Primary Examiner—Alyssa H. Bowler
Attorney, Agent, or Firm—Antonelli, Terry, Stout & Kraus

[57] ABSTRACT

A plurality of unit integrated circuits mounted on a large-scale integrated circuit device, for example, a wafer scale memory, are each provided with a bypass circuit which selectively shorts input and output nodes in the corresponding unit integrated circuit. By selectively bringing the bypass circuit into a transfer state, it is possible to effectively couple together all unit integrated circuits which are judged to be normal among a plurality of unit integrated circuits disposed along one row, for example. Improved redundancy arrangements are also provided, including first and second redundant elements for the unit integrated circuits, to effectively utilize the normal elements in the unit integrated circuits. Further, an improved arrangement for hierarchically connecting together the outputs of all the unit circuit blocks is provided which reduces the signal line load for the memory device.

21 Claims, 12 Drawing Sheets

FIG. 10

LARGE-SCALE INTEGRATED CIRCUIT DEVICE SUCH AS A WAFER SCALE MEMORY HAVING IMPROVED ARRANGEMENTS FOR BYPASSING, REDUNDANCY, AND UNIT INTEGRATED CIRCUIT INTERCONNECTION

BACKGROUND OF THE INVENTION

The present invention relates to a large-scale integrated circuit device and, more particularly, to a technique which may be effectively applied, for example, to a wafer scale memory or the like.

There is one type of large-scale integrated circuit device, for example, a wafer scale memory, which comprises a plurality of unit integrated circuits formed on the same wafer. In this type of large-scale integrated circuit device, a plurality of unit integrated circuits mounted thereon are selectively validated after the normality thereof has been confirmed by a given functional test.

Large-scale integrated circuit devices such as wafer scale memories are mentioned in British Patent laid-open publication numbers GB1377859, GB1525048, GB2173946, GB2174518, GB2177825 and GB2178204. Future trends in wafer scale integration are mentioned in PROCEEDINGS OF THE IEEE, VOL. 74, NO. 12, December 1986, p. 1741–p. 1752. A method of coupling unit integrated circuits by a logic switching circuit is mentioned in ELECTRONICS & POWER, April 1986, p. 283–p. 285. A method of relieving defects in a wafer scale memory is mentioned in Japanese Patent Laid-Open No. 63-266700 (laid open on Nov. 2, 1988).

SUMMARY OF THE INVENTION

The inventors of the present application have revealed that the above-described conventional wafer scale memories or other large-scale integrated circuit devices have the following problems.

First, if a data bus or the like which is mutually connected to a plurality of unit integrated circuits formed on the same wafer is spirally arranged as shown, for example, in ELECTRONICS & POWER, April 1986, p. 283–p. 285 or in the above-described publication number GB1377859, the length of the data bus or the like increases and this limits the reduction in the access time and the increase in the access speed of the wafer scale memory or the like. Further, the conventional arrangement that a defective chip is bypassed by directly connecting together non-defective chips which are adjacent to the defective chip causes an increase in the length of the data bus or the like, which results in the same problem as the above.

Secondly, in the case where defect relief processing is conducted for each unit memory integrated circuit in terms of being one complete unit, if it is detected that a unit memory integrated circuit has a number of abnormalities which exceeds the number of redundant elements prepared therefor, the unit memory integrated circuit is cut off as being defective even though the greater part of the elements therein are normal. This limits the product yield of wafer scale momories.

Thirdly, in the conventional output bus arrangement where all memory blocks formed on the same wafer are mutually connected to the common signal line, as the number of memory blocks integrated on the wafer increases, the resistance and capacitance components of the common signal line steadily increase. This results in such a situation that the determination of an operation of outputting data to the outside is delayed considerably. In addition, as the undesired parasitic capacitance increases as a result of the increase in the length of the common signal line, the charging-and-discharging current for driving the common signal line increases, and this increases the power consumption correspondingly.

It is a first object of the present invention to increase the operating speed of a large-scale integrated circuit device, for example, a wafer scale memory, comprising a multiplicity of unit integrated circuits formed on the same wafer.

It is a second object of the present invention to provide a semiconductor memory device, for example, a wafer scale memory, which is designed so that the efficiency of element usage is increased without lowering the packaging density.

It is a third object of the present invention to lower the power consumption of a wafer scale memory or the like.

The following is a brief summary of a typical one of the means for attaining mainly the first object of the present invention.

A plurality of unit integrated circuits mounted on a large-scale integrated circuit device, for example, a wafer scale memory, are successively coupled to a plurality of buses previously provided in parallel, and each unit integrated circuit is provided with a bypass circuit which selectively shorts input and output nodes of the corresponding unit integrated circuit. In addition, a plurality of unit integrated circuits mounted on a large-scale integrated circuit, for example, a wafer scale memory, are divided into groups so that a refresh operation is conducted in a time-division manner in each group or between the groups.

By virtue of the above-described means, all unit integrated circuits which are judged to be normal can be effectively coupled together by selectively bringing the bypass circuit into a transfer state and it is therefore possible to constitute a bus with the shortest distance. In other words, a defective chip is substantially bypassed through the bypass means provided in the defective chip between the input and output parts thereof. Thus, it is possible to shorten the access time and increase the access speed of a large-scale integrated circuit, for example, a wafer scale memory, having a plurality of unit integrated circuits mounted thereon and increase the validity rate thereof. In addition, since a plurality of unit integrated circuits are divided into groups so that a refresh operation is conducted in a time-division manner, it is possible to reduce the peak current in a large-scale integrated circuit, for example, a wafer scale memory, having a plurality of unit integrated circuits mounted thereon and achieve a lowering in the power consumption.

The following is a brief summary of a typical one of the means for attaining mainly the second object of the present invention.

In a wafer scale memory or the like including a plurality of unit memory integrated circuits, there are prepared first redundant elements provided in correspondence with the unit memory integrated circuits and capable of being allotted to desired addresses in the corresponding unit memory integrated circuits and second redundant elements provided in correspondence with the addresses in the unit memory integrated circuits and capable of being allotted to the corresponding addresses in desired unit memory integrated circuits.

The first and second redundant elements are allotted so that the validity rate of the unit memory integrated circuits at each address is above a predetermined value.

By virtue of the above-described means, it is possible to effectively utilize normal elements in all unit memory integrated circuits mounted on a wafer scale memory or the like and therefore the validity rate of the unit memory integrated circuits can be substantially increased. As a result, it is possible to increase the product yield and packaging density of the wafer scale memory and promote lowering in the production cost.

The following is a brief summary of a typical one of the means for attaining mainly the third object of the present invention.

A plurality of unit circuit blocks are divided into blocks and hierarchically connected together so that the outputs of all the unit circuit blocks are given directly and indirectly to the common output circuit with such a relation that the output of a predetermined unit circuit block included in one of the subdivided sets of unit circuit blocks is input to an output circuit in another unit circuit block, and the output of said another unit circuit block is utilized as an output common to the unit circuit blocks included in the same set.

By virtue of the above-described means, since a plurality of unit circuit blocks are hierarchically connected together, a signal line for giving the output of a desired unit circuit block to the common output circuit is comprised of sections which are connected together through output circuits included in each unit circuit block within the same stratum and between the strata and there is therefore no need for a signal line common to all the unit circuit blocks. Thus, the signal line load which should be driven by one output circuit included in each unit circuit block is made relatively small. Accordingly, it is possible to increase the speed of the operation of outputting data to the outside and lower the power consumption in a semiconductor integrated circuit wherein a plurality of unit circuit blocks are selectively activated to give the output of a selected unit circuit block to the outside through a common output circuit.

BRIEF DESCRIPTION OF THE DRAWINGS

FIG. 10 is a chart showing one example of allotment of redundant elements in the memory unit shown in FIG. 7;

DESCRIPTION OF THE PREFERRED EMBODIMENTS

Embodiment 1

Figure 1:
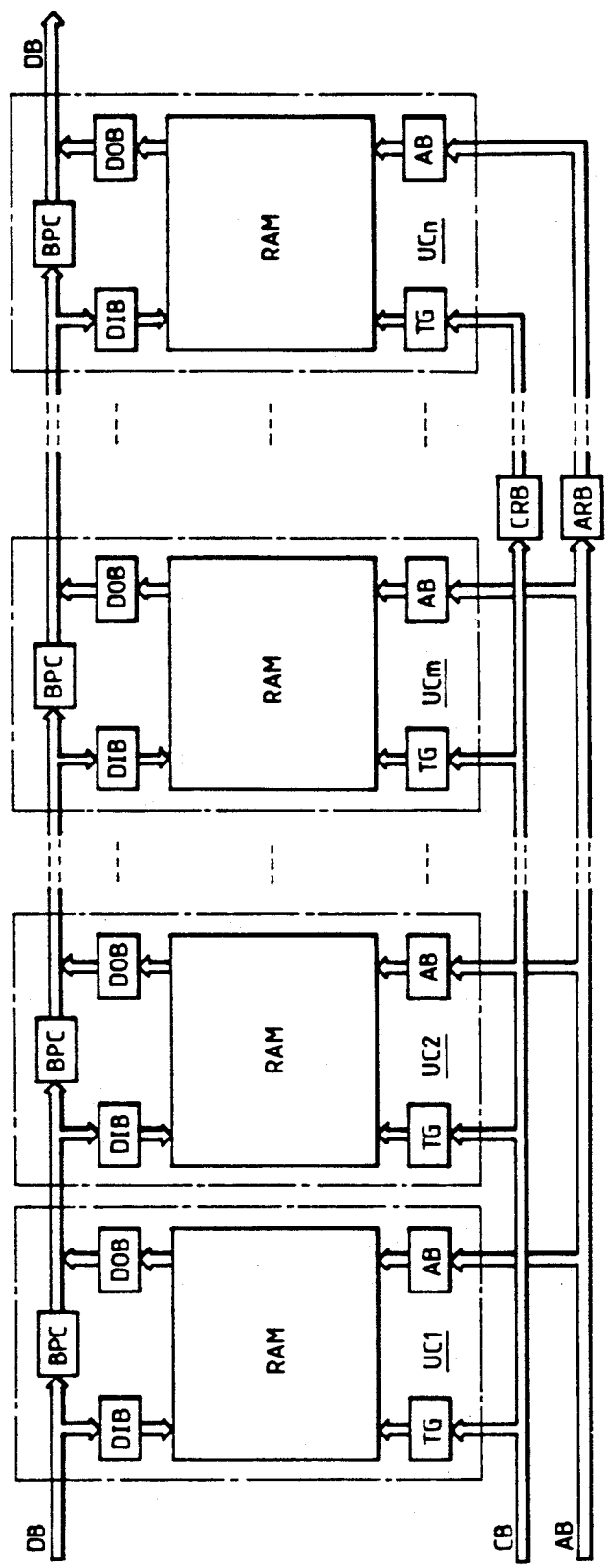
FIG. 1 is a block diagram of a part of a wafer scale memory to which the present invention is applied, which shows a first embodiment of the present invention.

FIG. 1 is a block diagram showing a part of a wafer scale memory to which the present invention is applied. The wafer scale memory according to this embodiment includes a plurality of unit integrated circuits which are disposed in a matrix on a single wafer such as single crystal silicon, although not necessarily limitative thereto. These unit integrated circuits are, although not necessarily limitative, divided into groups in the horizontal direction of the wafer, that is, along respective rows. These groups of unit integrated circuits are coupled to a plurality of data buses, address buses and control buses, respectively, which are disposed in parallel in the horizontal direction of the wafer for each group. In this embodiment, each of the unit integrated circuits constituting in combination a wafer scale memory has as a basic arrangement a memory array comprising dynamic memory cells which are disposed in a matrix. The operation of refreshing these unit integrated circuits is effected in a time-division manner in each individual group. The data buses, address buses and control buses to which the unit integrated circuits of the wafer scale memory are coupled for each group are, although not necessarily limitative, mutually coupled at respective bonding pads which are provided at each side of the wafer, and then coupled to the corresponding external buses. FIG. 1 exemplarily shows n unit integrated circuits UC1 to UCn disposed along the first column among a plurality of unit integrated circuits mounted on the wafer scale memory, together with a data bus DB, address bus AB and control bus CB to which these unit integrated circuits are coupled. The wafer scale memory is, although not necessarily limitative, packaged for each wafer as being one unit and further mutually coupled to other wafers in a predetermined combination, thereby constituting a memory unit for use in a computer system, for example.

In FIG. 1, each of the unit integrated circuits UC1 to UCn has a dynamic RAM (Random Access Memory) as a basic arrangement, although not necessarily limitative thereto. The dynamic RAM has as a basic arrangement a memory array comprising dynamic memory cells which are disposed in a matrix, as described later.

Each of the unit integrated circuits UC1 to UCn includes a data input buffer DIB which is coupled at the input terminal thereof to the data bus DB and a data output buffer DOB which is coupled at the output terminal thereof to the data bus DB, although not necessarily limitative thereto. A bypass circuit BPC is, although not necessarily limitative, provided between the input terminal of the data input buffer DIB and the output terminal of the data output buffer DOB. The bypass circuit BPC is, although not necessarily limitative, fixed in a transfer state when the corresponding one of the unit integrated circuits UC1 to UCn is judged to be defective as a result of a given functional test. When the corresponding one of the unit integrated circuits UC1 to UCn is judged to be normal as a result of the functional test and the corresponding unit integrated circuit is placed in a non-select state, the bypass circuit BPC is also selectively brought into a transfer state. In other words, when the corresponding one of the unit integrated circuits UC1 to UCn is judged to be normal and brought into a select state, the bypass circuit BPC is selectively brought into a non-transfer state. As a result, the corresponding one of the unit integrated circuits UC1 to UCn is alternatively and functionally coupled to the data bus DB. At this time, the data bus DB is brought into a transfer state as a whole through the unit integrated circuit brought into a select state and the other unit integrated circuits whose bypass circuits BPC are in a transfer state, thus constituting a series of system buses.

Figure 4:
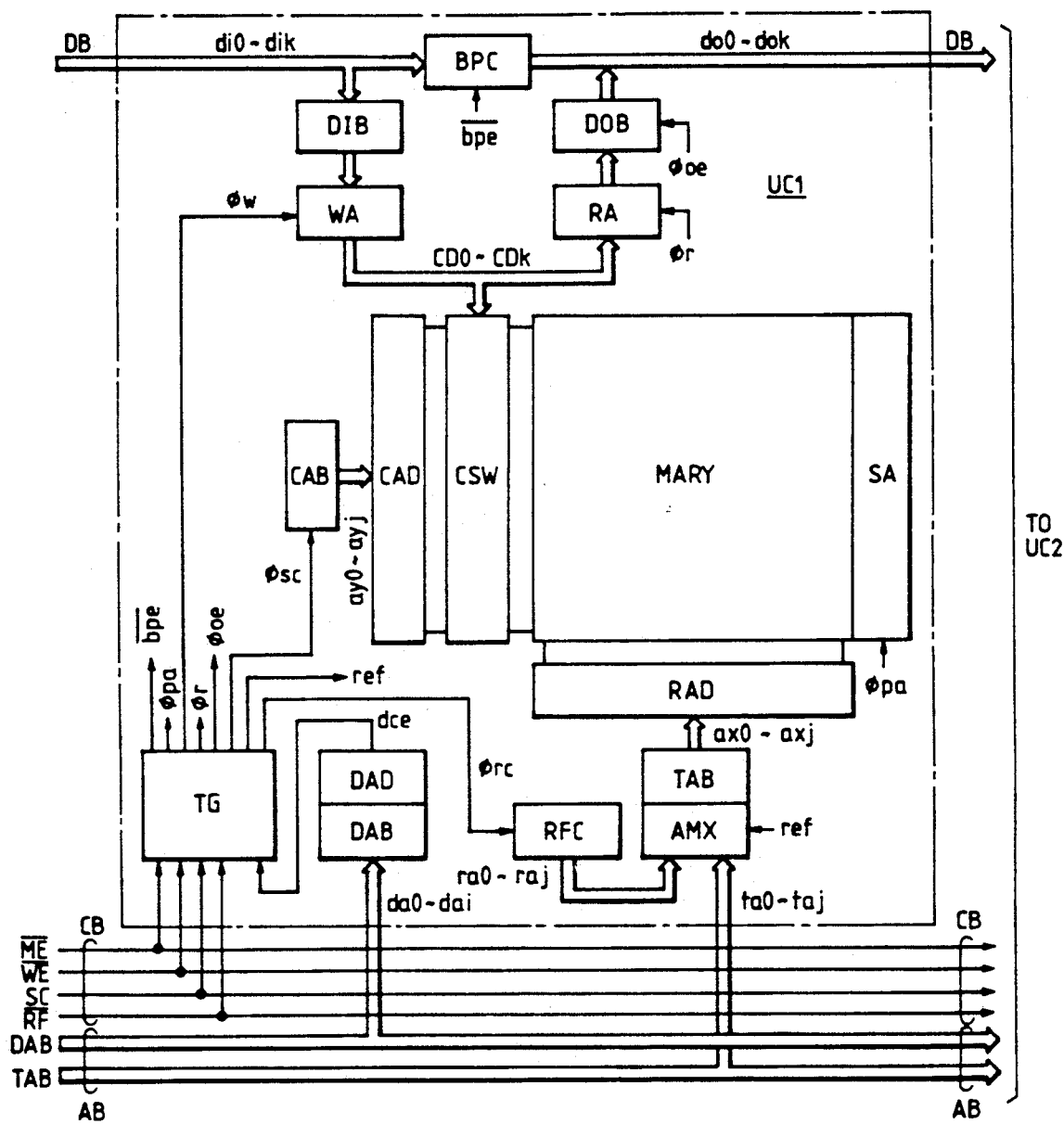
FIG. 4 is a block diagram showing one example of a unit integrated circuit of the wafer scale memory shown in FIG. 1.

Each of the unit integrated circuits UC1 to UCn further includes a timing generator TG and an address buffer AB, as shown in FIG. 1. The respective timing generators TG of the unit integrated circuits are coupled to a common control bus CB and selectively validated according to the result of the above-described functional test. The control bus CB includes a memory enable signal $\overline{ME}$, a write enable signal $\overline{WE}$ a serial clock signal SC and a refresh control signal $\overline{RF}$, as described later. Similarly, the respective address buffers AB of the unit integrated circuits are coupled to a common address bus AB and selectively validated according to the result of the above-described functional test. The address bus AB includes a device address bus DAB for selectively designating the unit integrated circuits and a track address bus TAB for designating the respective memory addresses of the unit integrated circuits, as shown in FIG. 4 and described later. In the wafer scale memory according to this embodiment, the control bus CB and the address buffer AB are respectively provided with a plurality of repeating buffers CRB and ARB at a predetermined regular distance, thereby making compensation for the attenuation in level of each control signal and address signals on the wafer.

Figure 5:
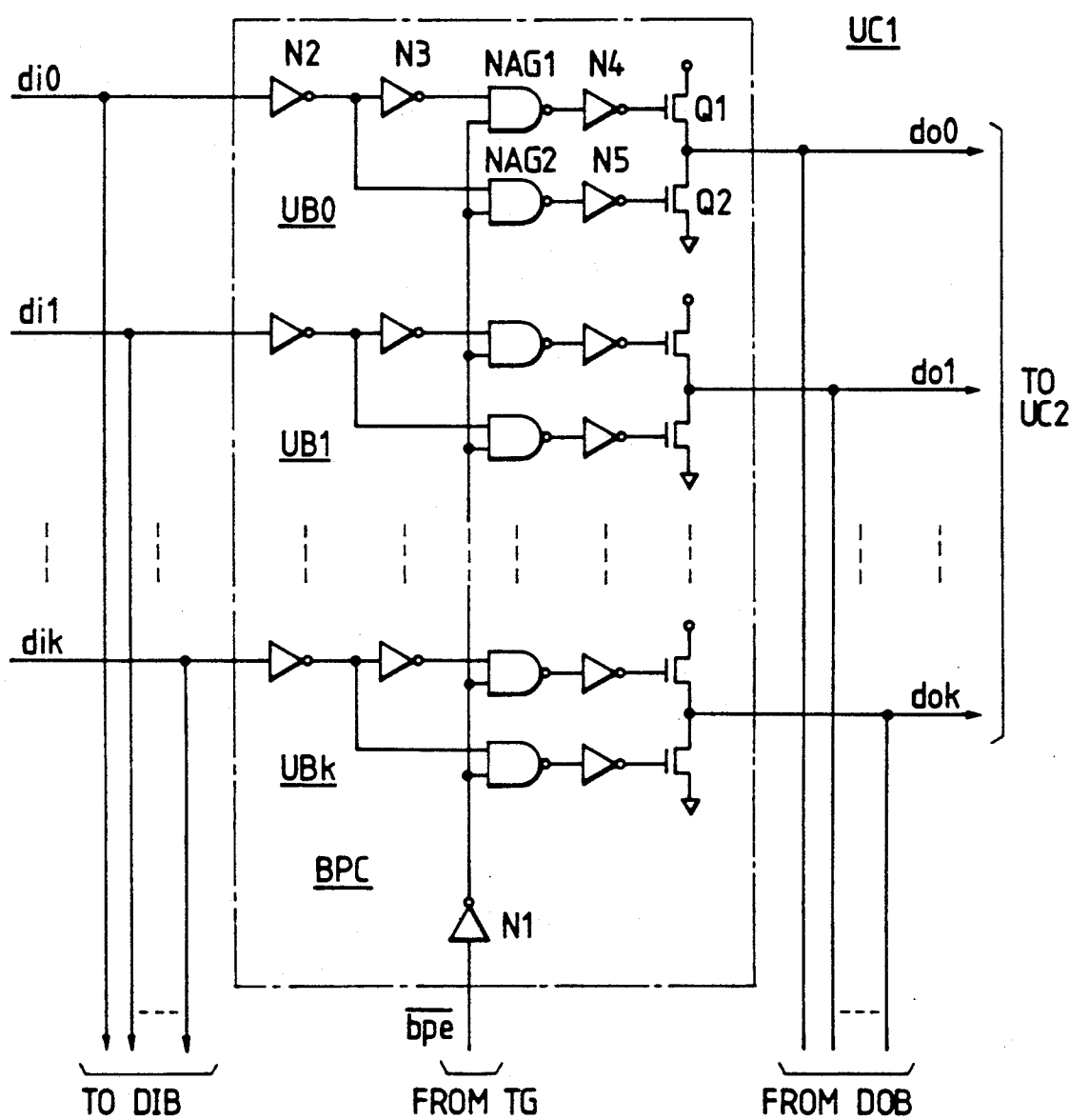
FIG. 5 is a circuit diagram showing one example of the bypass circuit included in the unit integrated circuit shown in FIG. 4.

FIG. 4 is a block diagram showing one example of the unit integrated circuit UC1 of the wafer scale memory shown in FIG. 1. FIG. 5 is a circuit diagram showing one example of the bypass circuit BPC of the unit integrated circuit UC1 shown in FIG. 4. The other unit integrated circuits UC2 to UCn that are mounted on the wafer scale memory basically have the same circuit configuration as that of the unit integrated circuit UC1. The arrangements of the unit integrated circuit UC1 and bypass circuit BPC according to this embodiment will be explained below with reference to FIGS. 4 and 5.

Each of the unit integrated circuits constituting the wafer scale memory of this embodiment has as a basic arrangement a memory array MARY which is disposed such as to occupy the greater part of the entire area of the unit integrated circuit. The memory array MARY includes a plurality of dynamic memory cells which are disposed in a matrix, as described above. In this embodiment, the unit integrated circuits are selectively started in accordance with i+1-bit device address signals da0 to dai which are supplied through the device address bus DAB. Therefore, each unit integrated circuit includes a device address decoder DAD which decodes the device address signals da0 to dai to selectively form an internal device select signal dce. When the corresponding unit integrated circuit is designated by the device address signals da0 to dai and the internal device select signal dce is raised to the high level, an inverted internal control signal $\overline{bpe}$ is raised to the high level. In this manner, the bypass circuit BPC is brought into a non-transfer state. In consequence, the corresponding unit integrated circuit is brought into a select state, thereby allowing a given write or read operation to be executed.

Each unit integrated circuit of this embodiment is, although not necessarily limitative, further supplied with j+1-bit track address signals ta0 to taj for alternatively designating the word lines in the memory array MARY. In this embodiment, each unit integrated circuit has a function whereby storage data is serially input or output for one word line at a time according to a serial clock signal SC. Therefore, each unit integrated circuit includes a column address buffer CAB in the form of a counter register which is stepped up in accordance with the serial clock signal SC to designate complementary data lines successively. As has been described above, each unit integrated circuit is selectively started in accordance with the device address signals da0 to dai to execute a given serial write or read operation. While the serial input or output operation is being executed, refreshing of storage data is conducted in the unit integrated circuits other than the designated one in a time-division manner for each group of unit integrated circuits, as described above.

In FIG. 4, the memory array MARY includes a plurality of word lines which are disposed vertically as viewed in the figure, a plurality of complementary data lines disposed horizontally, and a plurality of dynamic memory cells which are disposed in a matrix at the respective intersections of the word and complementary data lines, although not necessarily limitative thereto. The input and output terminals of a plurality of memory cells which are disposed along the same column in the memory array MARY are alternately coupled to a pair of non-inverted and inverted signal lines constituting the corresponding complementary data lines according to a predetermined rule. The control terminals of a plurality of memory cells which are disposed along the same rows in the memory array MARY are mutually coupled to the corresponding word lines, respectively.

The word lines constituting the memory array MARY are coupled to a row address decoder RAD and are alternatively brought into a select state. The row address decoder RAD is supplied with j+1-bit internal address signals ax0 to axj from a track address buffer TAB and also with a timing signal φx (not shown) from a timing generator TG.

The row address decoder RAD is selectively activated in response to the rise of the timing signal φx to the high level. When activated, the row address decoder RAD decodes the internal address signals ax0 to axj and alternatively brings the word lines in the memory array MARY into a select state, i.e., a high-level state, in accordance with the result of the docoding.

The track address buffer TAB is, although not necessarily limitative, supplied with predetermined row address signals from an address multiplexer AMX and also with a timing signal φar (not shown) from the timing generator TG.

In response to the rise of the timing signal φar to the high level, the track address buffer TAB takes in and holds the row address signals supplied from the address multiplexer AMX. In addition, the track address buffer TAB forms the internal address signals ax0 to axj on the basis of the row address signals, and supplies them to the row address decoder RAD.

One input terminal of the address multiplexer AMX is supplied with j+1-bit track address signals ta0 to taj through a track address bus TAB. The other input terminal of the address multiplexer AMX is supplied with j+1-bit refresh address signals ra0 to raj from a refresh address counter RFC. Further, the address multiplexer AMX is supplied with an internal control signal ref from the timing generator TG as a select control signal.

The address multiplexer AMX selectively transfers the track address signals ta0 to taj or the refresh address signals ra0 to raj in accordance with the internal control signal ref. More specifically, when the unit integrated circuit UC1 is brought into a select state in the normal operation mode and the internal control signal ref is shifted to the low level, the address multiplexer AMX selects the track address signals ta0 to taj and transfers them to the track address buffer TAB as being the above-described row address signals. When the unit integrated circuit UC1 is brought into a select state in the refresh mode and the internal control signal ref is raised to the high level, the address multiplexer AMX selects the refresh address signals ra0 to raj and transfers them to the track address buffer TAB as being the row address signals.

The refresh address counter RFC performs a stepping operation in accordance with a timing signal φrc supplied from the timing generator TG and forms the refresh address signals ra0 to raj.

On the other hand, the complementary data lines constituting the memory array MARY are coupled at one end side thereof to the corresponding unit amplifier circuits of a sense amplifier SA and at the other end side to the corresponding switching MOSFET pairs of a column switch CSW.

The sense amplifier SA includes a plurality of unit amplifier circuits which are provided in correspondence with the complementary data lines, respectively, in the memory array MARY. These unit amplifier circuits are mutually supplied with a timing signal φpa from the timing generator TG.

The unit amplifier circuits o the sense amplifier SA are selectively activated in response to the rise of the timing signal φpa to the high level. When activated, each unit amplifier circuit amplifies a minute readout signal which is output from a plurality of memory cells coupled to the selected one of the word lines in the memory array MARY to the corresponding complementary data lines to form either a high- or low-level binary readout signal.

The column switch CSW includes a plurality of pairs of switching MOSFETs which are provided in correspondence with the complementary data lines, respectively, in the memory array MARY. These switching MOSFETs are coupled at one end thereof to the corresponding complementary data lines in the memory array MARY. The other ends thereof are successively and mutually coupled to the corresponding complementary common data lines CD0 to CDk in units of k+1 pairs. The gates of these switching MOSFETs are successively and mutually coupled in units of k+1 pairs and respectively supplied with the corresponding data line select signals from a column address decoder CAD.

Switching MOSFETs in the column switch CSW that constitute each set of k+1 pairs simultaneously turn ON when the corresponding data line select signal is alternatively raised to the high level, thus selectively connecting together the corresponding k+1 pairs of complementary data lines in the memory array MARY and the corresponding one of the complementary common data lines CD0 to CDk.

The column address decoder CAD is supplied with j+1-bit internal address signals ay0 to ayj from the column address buffer CAB and also with a timing signal φy (not shown) from the timing generator TG.

The column address decoder CAD is selectively activated in response to the rise of the timing signal φy to the high level. When activated, the column address decoder CAD decodes the internal address signals ay0 to ayj and causes the data line select signals to be alternatively raised to the high level in accordance with the result of the decoding. Each of these data line select signals is supplied to the gates of the corresponding k+1 pairs of switching MOSFETs, as described above. In the wafer scale memory of this embodiment, the column address decoder CAD is a static decoder, and the internal address signals ay0 to ayj are successively stepped up in accordance with a serial clock signal SC supplied through the control bus. Accordingly, the above-described data line select signals are alternatively raised to the high level successively from the top, and, as a result, a plurality of memory cells which are coupled to the selected one of the word lines in the memory array MARY are successively selected in groups of k+1 memory cells. Thus a write or read operation is serially executed for each word line as one unit.

The column address buffer CAB comprises j+1-bit counter registers, although not necessarily limitative thereto. These counter registers are mutually supplied with a timing signal φsc from the timing generator TG.

The column address buffer CAB performs a stepping operation in accordance with the timing signal φsc to form and supply the internal address signals ay0 to ayj to the column address decoder CAD.

Incidentally, each of the unit integrated circuits UC1 to UCn in this embodiment includes a device address buffer DAB and a device address decoder DAD. The device address buffer DAB is supplied with i+1-bit device address signals da0 to dai through the device address bus DAB and also with a timing signal φda (not shown) from the timing generator TG.

In response to the rise of the timing signal φda to the high level, the device address buffer DAB takes in and holds the device address signals da0 to dai supplied through the device address bus DAB. These device address signals are further transferred to a device address decoder DAD.

The device address decoder DAD decodes the device address signals da0 to dai supplied through the device address buffer DAB. If these device address signals are decided to be a combination that designates the corresponding unit integrated circuit as a result of the decoding, the device address decoder DAD selectively raises the signal output therefrom, that is, the internal device select signal dce, to the high level. The internal device select signal dce is supplied to the timing generator TG. Thus, each unit integrated circuit is selectively started in accordance with the device address signals da0 to dai.

The complementary common data lines CD0 to CDk are, although not necessarily limitative, are coupled to the respective output terminals of the corresponding unit circuits of a write amplifier WA and are also coupled to the respective input terminals of the corresponding unit circuits of a read amplifier RA.

The write amplifier WA includes k+1 unit circuits which are provided in correspondence with the complementary common data lines CD0 to CDk, respectively. These unit circuits are respectively supplied with the corresponding bits that constitute write data from the corresponding unit circuits of a data input buffer DIB and are also supplied with a timing signal $\phi w$ from the timing generator TG.

Each unit circuit of the write amplifier WA is selectively activated in response to the rise of the timing signal $\phi w$ to the high level. When activated, each unit circuit of the write amplifier WA forms a complementary write signal in accordance with the write data supplied from the corresponding unit circuit of the data input buffer DIB and supplies it to the corresponding one of the complementary common data lines CD0 to CDk.

Similarly, the read amplifier RA includes k+1 unit circuits which are provided in correspondence with the complementary common data lines CD0 to CDk, respectively. The output terminals of these unit circuits are respectively coupled to the corresponding unit circuits of a data output buffer DOB. The unit circuits are mutually supplied with a timing signal $\phi r$ from the timing generator TG.

Each unit circuit of the read amplifier RA is selectively activated in response to the rise of the timing signal $\phi r$ to the high level. When activated, each unit circuit of the read amplifier RA further amplifies the binary readout signal which is output from the selected complementary data lines in the memory array MARY through the corresponding one of the complementary common data lines CD0 to CDk and transfers the amplified signal to the corresponding unit circuit of the data output buffer DOB.

The data input buffer DIB includes k+1 unit circuits which are provided in correspondence with the unit circuits of the write amplifier WA, although not necessarily limitative thereto. The input terminals of these unit circuits are respectively coupled to the corresponding bits of the data bus DB, while the output terminals thereof are respectively coupled to the input terminals of the corresponding unit circuits of the write amplifier WA.

When the unit integrated circuit UC1 is brought into a select state in the write mode, the unit circuits of the data input buffer DIB take in and hold write data di0 to dik supplied through the corresponding bits of the data bus DB. These pieces of write data are respectively transferred to the corresponding unit circuits of the write amplifier WA.

Similarly, the data output buffer DOB includes k+1 unit circuits which are provided in correspondence with the unit circuits of the read amplifier RA. The input terminals of these unit circuits are respectively coupled to the output terminals of the corresponding unit circuits of the read amplifier RA, while the output terminals thereof are respectively coupled to the corresponding bits of the data bus DB. The unit circuits of the data output buffer DOB are mutually supplied with a timing signal $\phi oe$ from the timing generator TG.

When the unit integrated circuit UC1 is brought into a select state in the read mode and the timing signal $\phi oe$ is raised to the high level, each unit circuit of the data output buffer DOB is selectively activated. When activated, each unit circuit of the data output buffer DOB delivers readout data transmitted from the corresponding unit circuit of the read amplifier RA to the corresponding bit of the data bus DB.

The wafer scale memory of this embodiment includes a bypass circuit BPC which is provided between the input terminal of the data input buffer DIB and the output terminal of the output buffer DOB, as described above. The bypass circuit BPC is, although not necessarily limitative, supplied with an inverted internal control signal $\overline{bpe}$ from the timing generator TG. The inverted internal control signal $\overline{bpe}$ is fixed to the low level when the corresponding unit integrated circuit is judged to be defective as a result of a given functional test. When the corresponding unit integrated circuit is judged to be normal as a result of the functional test and is placed in a non-select state, the inverted internal control signal $\overline{bpe}$ is set at the low level. When the corresponding unit integrated circuit is brought into a select state, the signal $\overline{bpe}$ is selectively raised to the high level.

The bypass circuit BPC includes k+1 unit circuits UB0 to UBk which are provided in correspondence with the bits of the data bus DB, as shown in FIG. 5. Each of the unit circuits UB0 to UBk includes, although not necessarily limitative, a pair of N-channel output MOSFETs Q1 and Q2 which are provided in series between the supply voltage and ground potential points of the circuit, as representatively shown by the unit circuit UB0 to FIG. 5. The potential at the mutually coupled source and drain of these MOSFETs Q1 and Q2 is supplied as being one of the output signals do0 to dok from each unit circuit to the data bus DB, and is thus transferred to a unit integrated circuit UC2 in the subsequent stage.

The gates of the MOSFETs Q1 and Q2 are respectively coupled to the output terminals of CMOS inverters N4 and N5. The input terminals of the inverters N4 and N5 are respectively coupled to the output terminals of NAND gates NAG1 and NAG2. One input terminal of the NAND gate NAG1 is coupled to the output terminal of a CMOS inverter N3, while one input terminal of the NAND gate NAG2 is coupled to the output terminal of a CMOS inverter N2. The other input terminals of the NAND gates NAG1 and NAG2 are mutually supplied with a signal obtained by inverting the inverted internal control signal $\overline{bpe}$ through a CMOS inverter N1, that is, a non-inverted internal control signal bpe. The input terminal of the inverter N3 is coupled to the output terminal of the inverter N2. The input terminal of the inverter N2 is coupled to the corresponding one of the bits of the data bus DB as being the input terminal of each of the unit circuits UB0 to UBk and supplied with the corresponding one of the input signals di0 to dik.

Thus, the output MOSFET Q1 is selectively turned ON when the output signal from the inverter N4 is raised to the high level, that is, when the inverted internal control signal $\overline{bpe}$ is at the low level and the corresponding one of the input signals di0 to dik is at the high level. As a result, the corresponding one of the output signals do0 to dok from the unit integrated circuit UC1 is raised to a high level such as the supply voltage of the circuit. On the other hand, the output MOSFET Q2 is selectively turned ON when the output signal from the inverter N5 is raised to the high level, that is, when the inverted internal control signal $\overline{bpe}$ is at the low level and the corresponding one of the input signals di0 to dik is at the low level. As a result, the corresponding one of the output signals do0 to dok from the unit integrated circuit UC1 is shifted to a low level such as the ground potential of the circuit. In other words, the unit circuits UB0 to UBk of the bypass circuit BPC are selectively brought into a transfer state in response to the shift of the inverted internal control signal $\overline{bpe}$ to the low level to transfer the input signals di0 to dik supplied through the data bus DB to the post-stage unit integrated circuit UC2 through the data bus DB as being the corresponding output signals do0 to dok without any change.

The timing generator TG forms the above-described various timing signals and internal control signals on the basis of the memory enable signal $\overline{ME}$, write enable signal $\overline{WE}$, serial clock signal SC and refresh control signal $\overline{RF}$ supplied through the control bus CB and the internal device select signal dce supplied from the device address decoder DAD and supplies them to the various circuits in the unit integrated circuit UC1.

Figure 6:
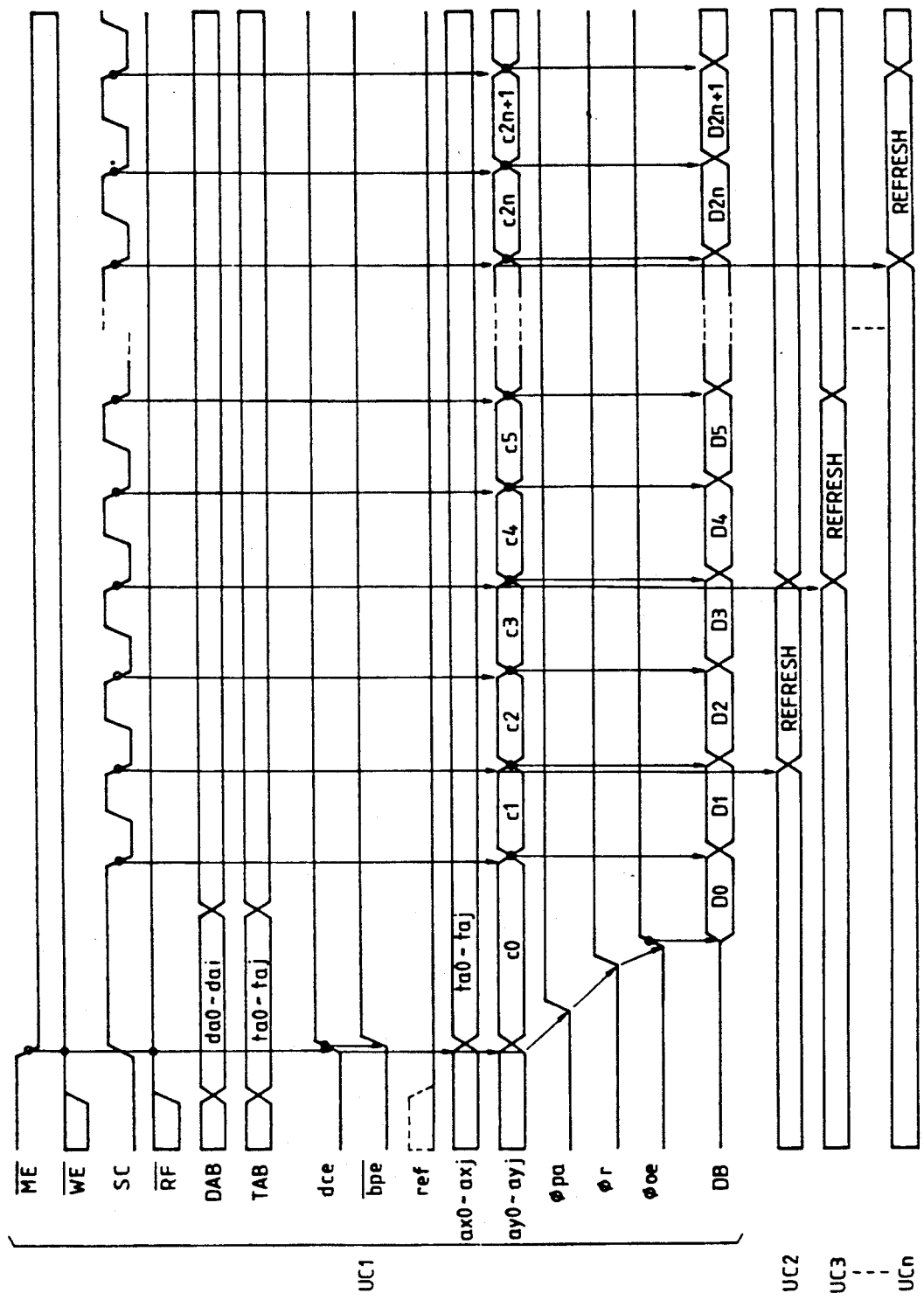
FIG. 6 is a timing chart showing one example of the operation of the unit integrated circuit shown in FIG. 4 in the serial read mode.

FIG. 6 is a timing chart showing one example of the operation of the unit integrated circuit UC1 shown in FIG. 4 in the serial read more. The figure exemplarily shows an operation taking place when the unit integrated circuit UC1 is brought into a select state, together with the refresh operation of the other unit integrated circuits UC2 to UCn in the same group. The operation of the wafer scale memory according to this embodiment in the serial read mode and refresh mode will briefly be explained below with reference to FIG. 6, together with FIGS. 4 and 5.

Referring to FIG. 6, the unit integrated circuit UC1 is brought into a non-select state in response to the rise of the memory enable signal $\overline{ME}$ to the high level. At this time, the internal device select signal dce is shifted to the low level, so that the inverted internal control signal $\overline{bpe}$ is shifted to the low level. Accordingly, in all unit integrated circuits of the wafer scale memory which are judged to be normal, the bypass circuits BPS are brought into a transfer state, so that the data bus DB is placed in such a state that it bypasses these unit integrated circuits.

The memory enable signal $\overline{ME}$ is changed from the high level to the low level and, at the same time, the serial clock signal SC is changed from the low level to the high level. Prior to this, both the write enable signal $\overline{WE}$ and the refresh control signal $\overline{RF}$ are raised to the high level, so that the device address bus DAB is supplied with the device address signals da0 to dai in a combination by which the unit integrated circuit UC1 is designated. Further, the track address bus TAB is supplied with the track address signals ta0 to taj in a combination by which a desired word line is designated.

In the unit integrated circuit UC1, at the point of time when the memory enable signal $\overline{ME}$ is changed to the low level, the internal device select signal dce is raised to the high level, thus bringing the unit integrated circuit UC1 into a select state. More specifically, in response to the rise of the internal device select signal dce to the high level, the inverted internal control signal $\overline{bpe}$ is first raised to the high level, thus bringing the bypass circuit BPC into a non-transfer state. Further, the track address signals ta0 to taj that are supplied through the track address bus TAB are taken into the row address buffer RAB, and the column address buffer CAB is brought into a reset state. Thus, in the unit integrated circuit UC1, an operation of selecting a word line designated by the track address signals is initiated.

After a predetermined period of time, the timing signal $\phi pa$ is raised to the high level, and then the timing signals $\phi r$ and $\phi oe$ are successively raised to the high level with a decreasing delay. In the unit integrated circuit UC1, the unit amplifier circuits of the sense amplifier SA are simultaneously activated in response to the rise of the timing signal $\phi pa$ to the high level. As a result, minute readout signals which are output from a plurality of memory cells coupled to the selected word line in the memory array MARY to the corresponding complementary data lines are amplified to form high- or low-level binary readout signals.

In the column address select circuit, on the other hand, an operation of selecting complementary data lines designated by the column address buffer CAB, that is, $k+1$ pairs of complementary data lines corresponding to the top column address c0, is executed. As a result, binary readout signals established on the $k+1$ pairs of complementary data lines corresponding to the column address c0 are transferred to the corresponding unit circuits of the read amplifier RA through the complementary common data lines CD0 to CDk. In response to the rise of the timing signal $\phi r$ to the high level, these binary readout signals are further amplified in the corresponding unit circuits of the read amplifier RA. In response to the rise of the timing signal $\phi oe$ to the high level, the amplified binary readout signals are delivered to the corresponding bits of the data bus DB from the data output buffer DOB.

After a predetermined period of time, the serial clock signal SC is changed from the high level to the low level and thereafter repeatedly changed between the high and low levels at a predetermined period.

In the unit integrated circuit UC1, the column address buffer CAB is stepped up in synchronism with the fall edge of the serial clock signal SC, although not necessarily limitative thereto. As a result, $k+1$ pairs of complementary data lines corresponding to each column address are successively selected, and bits of data stored in the memory cells coupled to these complementary data lines are serially read out.

In the other unit integrated circuits UC2 to UCn that are disposed in the same group with the unit integrated circuit UC1, an operation of refreshing storage data is executed in a time-division manner while the serial read operation is being conducted in the unit integrated circuit UC1. More specifically, in this embodiment a read-only memory is provided in the timing generator TG of each unit integrated circuit to designate a timing at which a refresh operation should be executed. Accordingly, in the unit integrated circuit UC2, for example, a refresh operation, is executed during the period from the second fall of the serial clock signal SC to the fourth fall thereof, whereas, in the unit integrated circuit UC3, a refresh operation is executed during the period from the fourth fall of the serial clock signal SC to the sixth fall thereof. Similarly, in the unit integrated circuits UC4 to UCn, a refresh operation takes place successively in a time-division manner with a delay corresponding to two periods of the serial clock signal SC. As a result, the peak current in the wafer scale memory due to the refresh operation is reduced, thus achieving a lowering in the power consumption of the wafer scale memory.

As has been described above, the wafer scale memory according to this embodiment includes a plurality of unit integrated circuit which are disposed in a matrix on a single wafer. These unit integrated circuits are divided into groups in correspondence with the rows and mutually coupled to a plurality of data buses, respectively, which are previously disposed in parallel in the horizontal direction of the wafer. In this embodiment, each unit integrated circuit has a bypass circuit BPC. The bypass circuit BPC is selectively brought into a transfer state when the corresponding unit integrated circuit is judged to be defective or when the corresponding unit integrated circuit is judged to be normal and placed in a non-select state. As a result, the unit integrated circuits are selectively invalidated, and a series of data buses DB are constituted through these bypass circuits BPC. Thus, a multiplicity of unit integrated circuits that constitute in combination a wafer scale memory are coupled together through buses with the shortest distance, so that the access time of the wafer scale memory is shortened and the access speed is thus increased. Further, in the wafer scale memory of this embodiment, the operation of refreshing each unit integrated circuit is executed in each of the groups in time-division manner. As a result, the peak current in the wafer scale memory due to the refresh operation is reduced, thus achieving a lowering in the power consumption.

As has been shown in the foregoing embodiment, application of the present invention to a large-scale integrated circuit device, for example, a wafer scale memory, provides the following advantages:

(1) Among a plurality of unit integrated circuits mounted on a large-scale integrated circuit device, for example, a wafer scale memory, all unit integrated circuits which are judged to be normal can be coupled together through buses with the shortest distance by successively coupling the unit integrated circuits of the device to a plurality of buses previously provided in parallel and providing each unit integrated circuit with a bypass circuit which selectively shorts the input and output nodes of the corresponding unit integrated circuit.

(2) By virtue of the advantage (1), the transfer delay time in a large-scale integrated circuit device, for example, a wafer scale memory, having a plurality of unit integrated circuits mounted thereon can be reduced, and hence the access time can be shortened.

(3) By virtue of the advantages (1) and (2), it is possible to increase the bit rate of a digital system including a wafer scale memory or the like.

(4) By virtue of the advantage (1), it is possible to prevent a unit integrated circuit judged to be normal from being invalidated, and hence possible to increase the validity rate of a large-scale integrated circuit device, for example, a wafer scale memory, having a plurality of unit integrated circuits mounted thereon.

(5) In regard to the advantage (1), since a wafer scale memory can adopt any desired bit pattern by changing the bus structure, it is possible to impart flexibility to the bus structure of a large-scale integrated circuit device, for example, a wafer scale memory, having a plurality of unit integrated circuits mounted thereon.

(6) It is possible to reduce the peak current in a large-scale integrated circuit device, for example, a wafer scale memory, by dividing a plurality of unit integrated circuits mounted on such a large-scale integrated circuit device into groups and executing a refresh operation in each group or between the groups in a time-division manner.

(7) By virtue of the advantage (6), it is possible to lower the power consumption of a large-scale integrated circuit device, for example, a wafer scale memory, having a plurality of unit integrated circuits mounted thereon.

Figure 2:
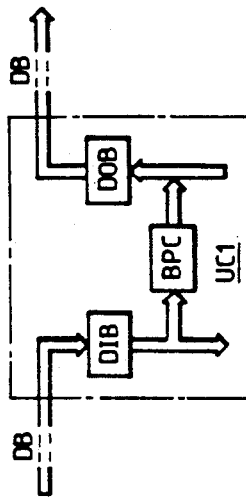
FIG. 2 is a block diagram showing a modification of a part of the arrangement shown in FIG. 1.
Figure 3:
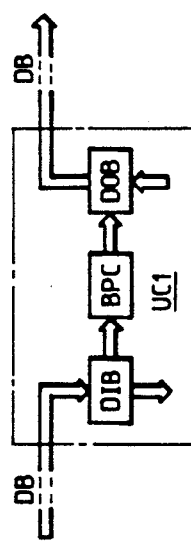
FIG. 3 is a block diagram showing another modification of a part of the arrangement shown in FIG. 1.

Although the invention accomplished by the present inventors has been described specifically by way of one example, it should be noted here that the present invention is not necessarily limited to the described embodiment, and that various changes and modifications may, of course, be imparted thereto without departing from the gist and scope of the invention. For instance, although in the embodiment shown in FIG. 1 the bypass circuit BPC is provided outside the data input buffer DIB and the data output buffer DOB of each unit integrated circuit, the bypass circuit BPC may also be provided at such a position as those shown in FIGS. 2 and 3. More specifically, in the modification shown in FIG. 2, the bypass circuit BPC is provided between a predetermined internal node of the data input buffer DIB and a predetermined internal node of the data output buffer DOB. In this case, a part of the data input buffer DIB and a part of the data output buffer DOB, for example, level changing circuits, are shared with the bypass circuit BPC, thereby simplifying the arrangement of the bypass circuit BPC. In the modification shown in FIG. 3, on the other hand, the bypass circuit BPC is provided between the output terminal of the data input buffer DIB and the input terminal of the data output buffer DOB. In this case, the repeating functions of the data input buffer DIB and the data output buffer DOB are shared with the bypass circuit BPC, so that the bypass circuit BPC is constituted by a mere switching logic gate circuit alone. The arrangement shown in FIG. 3, however, has the disadvantage that the transfer delay time of each unit integrated circuit increases from the viewpoint of the databus DB. The repeating buffers CRB and ARB that are provided on the control bus CB and the address bus AB, respectively, in the arrangement shown in FIG. 1 may be constituted by those which are selected according to the distance from repeating buffers CRB and ARB which are previously provided for all the unit integrated circuits. The data bus DB may adopt any desired bus structure. For example, it may be provided in correspondence with a plurality of groups of unit integrated circuits disposed along a plurality of rows. In FIG. 4, each unit integrated circuit may be arranged such that it has no serial input/output function and storage data is input and output bit by bit. The memory array MARY may be constituted by a plurality of memory mats. In FIG. 5, each logic gate circuit may be constituted by a Bi.CMOS composite logic gate circuit or the like. The unit integrated circuit refreshing operation may be conducted in such a manner that refresh operations which are executed in the respective groups are carried out in a time-division manner. Further, various changes and modifications may be imparted to the block arrangement of each unit integrated circuit shown in FIG. 4, the specific circuit configuration of the bypass circuit BPC shown in FIG. 5 and the combination of control signals and address signals.

Although in the foregoing the invention accomplished by the present inventors has been described mainly by way of one example in which it is applied to a wafer scale memory which belongs to the applicable field of the present invention, it should be noted here that the present invention is not necessarily limited thereto, and that it may also be applied to logic integrated circuits, for example, gate arrays, and other wafer scale integrated circuits. The present invention may be widely applied to large-scale integrated circuits each including a plurality of unit integrated circuits which are formed on a single wafer and selectively validated.

Embodiment 2

Figure 7:
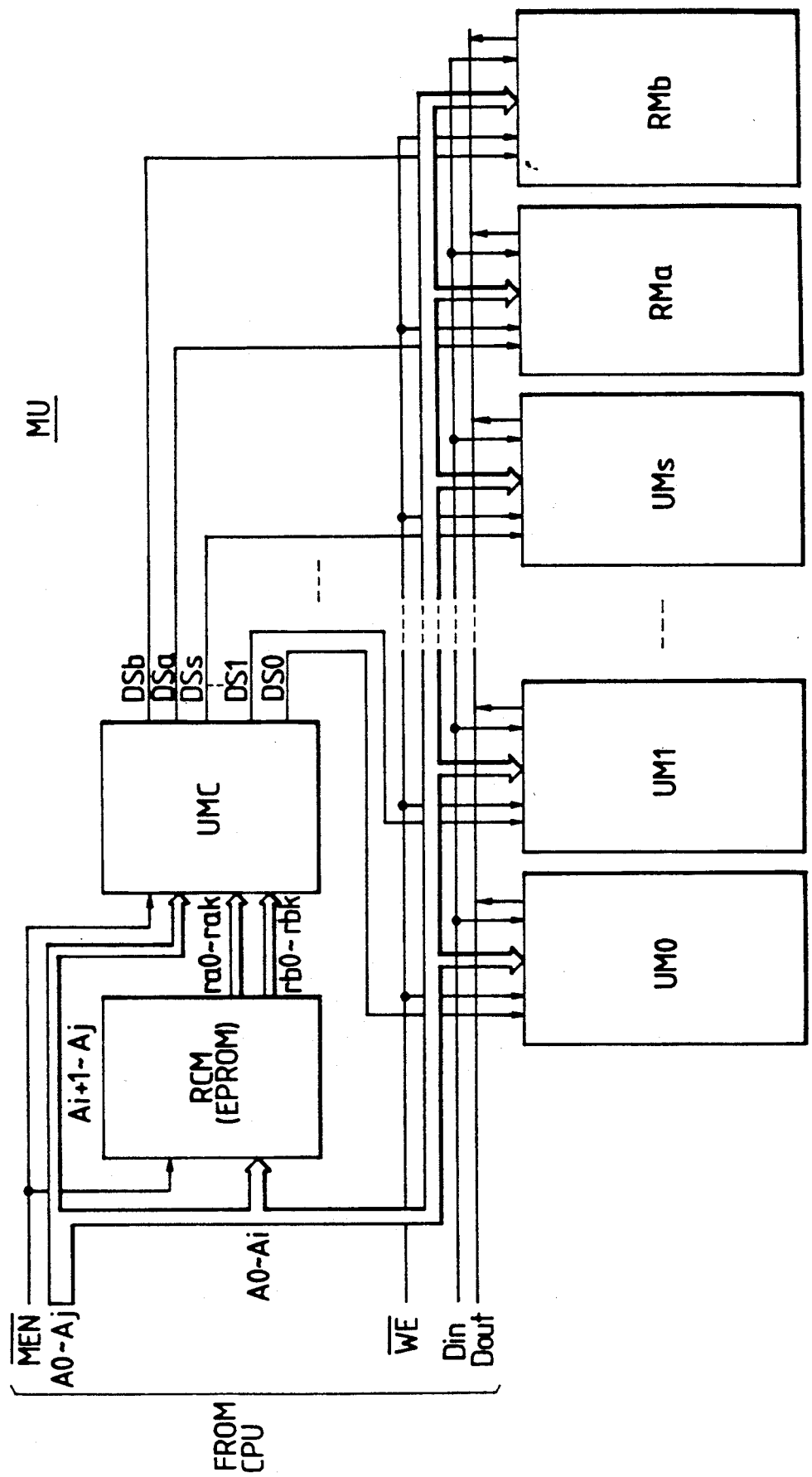
FIG. 7 is a block diagram of a part of a wafer scale memory in the form of a memory unit to which the present invention is applied, which shows a second embodiment of the present invention.
Figure 8:
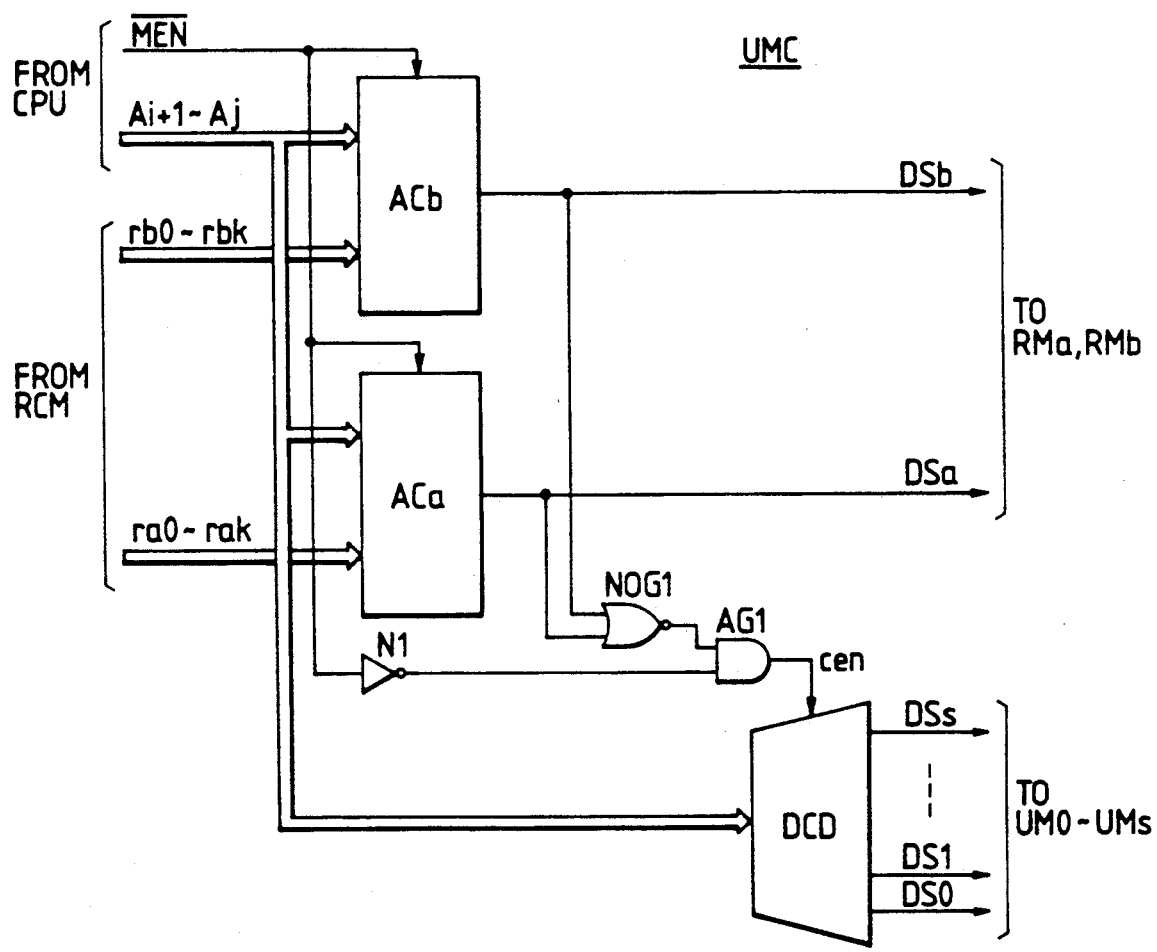
FIG. 8 is a block diagram showing one example of the memory unit control circuit of the memory unit shown in FIG. 7.
Figure 9:
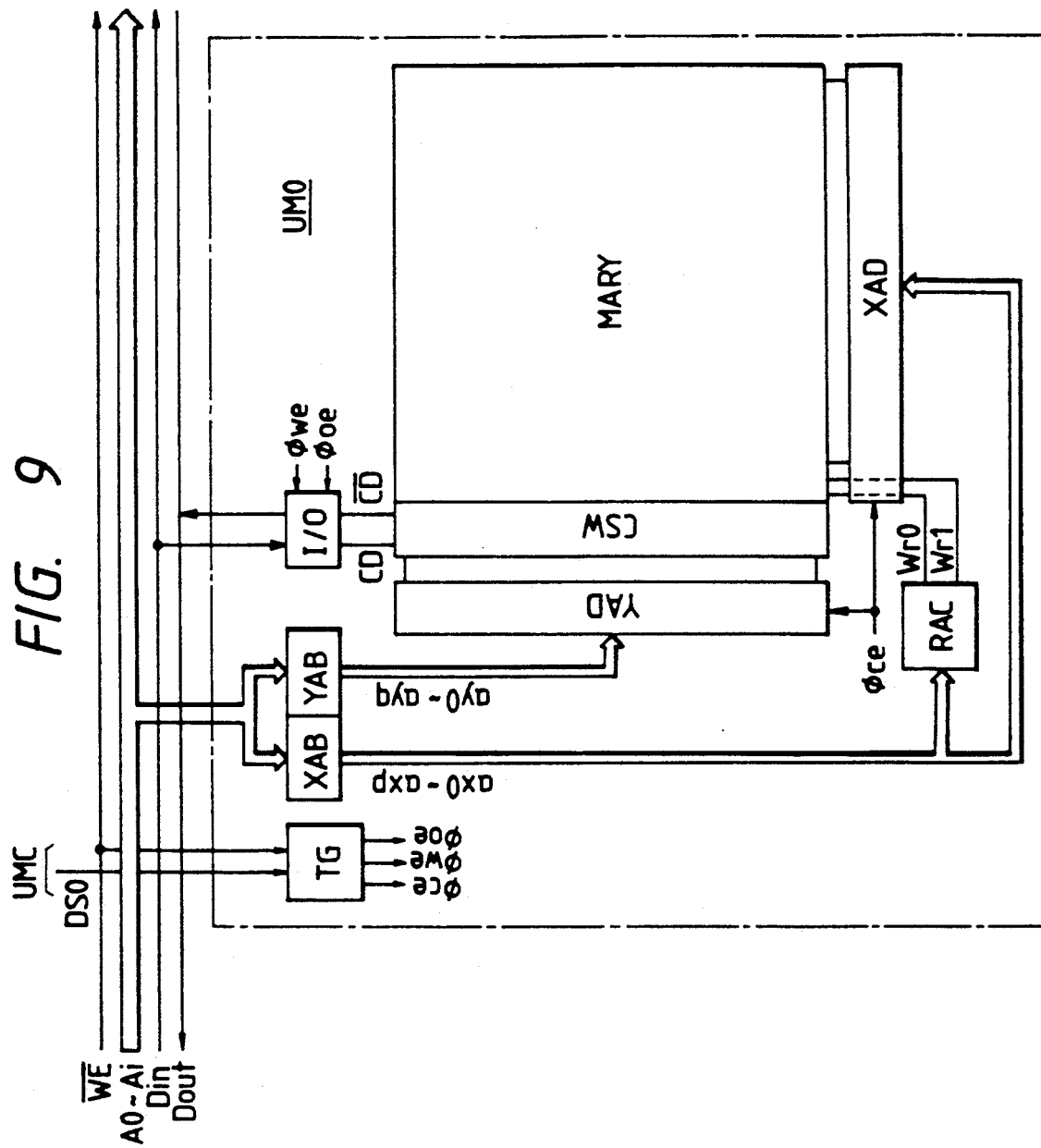
FIG. 9 is a block diagram showing one example of a unit memory integrated circuit of the memory unit shown in FIG. 7.

FIG. 7 is a block diagram of a part of a memory unit MU to which the present invention is applied. FIGS. 8 and 9 are block diagrams respectively showing examples of the memory control unit UMC and unit memory integrated circuit UM0 of the memory unit MU shown in FIG. 7. The outlines of the arrangement and operation of the memory unit MU according to this embodiment will be explained below with reference to these figures.

The memory unit MU of this embodiment is constituted by a so-called wafer scale memory and includes $s+1$ unit memory integrated circuits UM0 to UMs and redundant memory integrated circuits RMa, RMb, together with a memory control circuit UMC and a redundant control memory RCM which are provided in common to the unit memory integrated circuits and the redundant memory integrated circuits, all these elements being formed on a single wafer such as single crystal silicon, although not necessarily limitative thereto. The memory unit MU is packaged for each wafer as being one unit to constitute, for example, a main storage device in a computer system.

Each of the unit memory integrated circuits UM0 to UMs has as a basic arrangement a memory array including $m+1$ word lines, $n+1$ pairs of complementary data lines, and $(m+1) \times (n+1)$ memory cells which are disposed in a matrix at the respective intersections of the word and complementary data lines, although not necessarily limitative thereto. This memory array further includes two redundant word lines Wr0, Wr1 and $2 \times (n+1)$ memory cells which are disposed at the respective intersections of these redundant word lines and the above-described complementary data lines, although not necessarily limitative thereto. The redundant word lines Wr0, Wr1 and the $2 \times (n+1)$ memory cells which are coupled thereto can be allotted as being first redundant elements to any defective addresses in the corresponding unit memory integrated circuit.

The redundant memory integrated circuit RMa and RMb are, although not necessarily limitative, arranged in the same way as in the case of the unit memory integrated circuits UM0 to UMs. In each of the redundant memory integrated circuits RMa and RMb, $m+1$ word lines and $(m+1) \times (n+1)$ memory cells which are coupled thereto can be allotted as being second redundant elements to any unit memory integrated circuit in which the word lines at the corresponding row addresses have been judged to be defective.

In this embodiment, the first redundant elements, i.e., the redundant word lines Wr0, Wr1 and the associated memory cells, which are provided in each unit memory integrated circuit, and the second redundant elements, i.e., the word lines and the associated memory cells, which are provided in each of the redundant memory integrated circuits RMa and RMb, are allotted according to a predetermined algorithm so that the number of valid unit memory integrated circuits is $s+1$ or more for every word line address, that is, every row address in the memory unit MU, as described later. Thus, the memory unit MU functions as a storage device having an address structure comprising $s \times (m+1) \times (n+1) \times 1$ bits.

Referring to FIG. 7, the memory unit MU is, although not necessarily limitative, connected to an external central processing unit CPU through $j+1$-bit address buses A0 to Aj, a data input bus Din, a data output bus Dout and control buses including a memory enable signal $\overline{MEN}$ and write enable signal $\overline{WE}$. Among these buses, the memory enable signal $\overline{MEN}$ is coupled to both the memory control unit UMC and the redundant control memory RCM, while the write enable signal $\overline{WE}$, the data input bus Din and the data output bus Dout are mutually coupled to the unit memory integrated circuits UM0 to UMs and the redundant memory integrated circuits RMa and RMb. The address buses A0 to Aj are divided into two groups, that is, $j-1$-bit address signals $Ai+1$ to Aj that designate in combination the device code of each unit memory integrated circuit and $i+1$-bit address signals A0 to Ai for designating an address in each unit memory integrated circuit. The address signals $Ai+1$ to Aj are coupled to the memory control circuit UMC, while the address signals A0 to Ai are mutually coupled to the unit memory integrated circuits UM0 to UMs.

The redundant control memory RCM is constituted by an EPROM (Erasable and Programmable Read Only Memory) or the like and has $m+1$ addresses corresponding to the row addresses of each of the redundant memory integrated circuits RMa and RMb. These addresses are previously stored with the respective device codes of the unit memory integrated circuits UM0 to Ums which are allotted to the word lines, respectively, of each of the redundant memory integrated circuits RMa and RMb.

The redundant control memory RCM is, although not necessarily limitative, selectively activated in response to a low-level memory enable signal $\overline{MEN}$ supplied from the central processing unit CPU. When activated, the redundant control memory RCM reads out from the address designated by the low-order address signals A0 to Ai the device code of a unit memory integrated circuit allotted to the corresponding word line in each of the redundant memory integrated circuits RMa and RMb, that is, defective device codes ra0 to rak and rb0 to rbk, and supplies the readout codes to the memory control circuit UMC.

The memory control circuit UMC includes two address comparators ACa, ACb and a device code decoder DSD, as shown in FIG. 8, although not necessarily limitative thereto. One input terminal of each of the address comparators ACa and ACb is mutually supplied with the device code, that is, the address signals $Ai+1$ to Aj, supplied from the central processing unit CPU, while the other input terminals of the address comparators ACa and ACb are supplied with the defective device codes ra0 to rak and rb0 to rbk, respectively. Further, the address comparators ACa and ACb are mutually supplied with the memory enable signal $\overline{\text{MEN}}$.

The address comparator ACa is selectively activated in response to the shift of the memory enable signal $\overline{\text{MEN}}$ to the low level, although not necessarily limitative thereto. When activated, the address comparator ACa makes a comparison between the device code, that is, the address signals Ai+1 to Aj, supplied from the central processing unit CPU and the defective device code ra0 to rak supplied from the redundant control memory RCM. If all the bits of these device codes are coincident with each other as a result of the comparison, the address comparator ACa raises its output signal, that is, a device select signal DSa, to the high level. Similarly, the address comparator ACb is selectively activated in response to the shift of the memory enable signal $\overline{\text{MEN}}$ to the low level. When activated, the address comparator ACb makes a comparison between the address signals Ai+1 to Aj and the defective device code rb0 to rbk supplied from the redundant control memory RCM. If all the bits of these device codes are coincident with each other as a result of the comparison, the address comparator ACb raises its output signal, that is, a device select signal DSb, to the high level.

The device select signals DSa and DSb which are respectively output from the address comparators ACa and ACb are supplied to the corresponding redundant memory integrated circuits RMa and RMb, respectively, and are, although not necessarily limitative, also supplied to a pair of input terminals, respectively, of a NOR gate NOG1. The output signal from the NOR gate NOG1 is supplied to one input terminal of an AND gate AG1. The other input terminal of the AND gate AG1 is supplied with a signal obtained by inverting the memory enable signal $\overline{\text{MEN}}$ through an inverter N1. The output signal from the AND gate AG1 is supplied to the device code decoder DCD as being an internal control signal cen. Thus, the internal control signal cen is selectively raised to the high level when the memory enable signal $\overline{\text{MEN}}$ is at the low level and both the device select signals DSa and DSb are at the low level.

The device code decoder DCD is further supplied with the above-described device code, that is, the address signals Ai+1 to Aj. The device decoder DCD is selectively activated in response to the rise of the internal control signal cen to the high level. When activated, the device code decoder DCD decodes the address signals Ai+1 to Aj and alternatively raises to the high level the one of the device select signals DS0 to DSs in accordance with the result of the decoding. More specifically, when the memory enable signal $\overline{\text{MEN}}$ is at the low level and the defective device code read out from the corresponding address in the redundant control memory RCM is not coincident with the device code given from the central processing unit CPU, the device select signals DS0 to DSs are alternatively raised to the high level in correspondence with the device code. These device select signals DS0 to DSs are supplied to the corresponding unit memory integrated circuits UM0 to UMs, respectively.

Each of the unit memory integrated circuits UM0 to UMs has as a basic arrangement a memory array MARY which is disposed such as to occupy the greater part of the area thereof, as representatively shown by the unit memory integrated circuit UM0 in FIG. 9.

The memory array MARY includes m+1 word lines and two redundant word lines Wr0, Wr1 which are disposed in parallel in the vertical direction as viewed in FIG. 9 and n+1 pairs of complementary data lines disposed in parallel in the horizontal direction. In addition, (m+1)×(n+1) memory cells are disposed in a matrix at the respective intersections of the word lines and the complementary data lines.

The m+1 word lines that constitute the memory array MARY are coupled to an X-address decoder XAD and alternatively brought into a select state. The two redundant word lines Wr0 and Wr1 are coupled to a redundant address changing circuit RAC.

The X-address decoder XAD is, although not necessarily limitative, supplied with p+1-bit internal address signals ax0 to axp from an X-address buffer XAB and also with a timing signal $\phi$ce from a timing generator TG. The timing signal $\phi$ce is normally at the low level and selectively raised to the high level when the corresponding one of the device select signals DS0 to DSs is raised to the high level and the corresponding unit memory integrated circuit is brought into a select state.

The X-address decoder XAD is selectively activated in response to the rise of the timing signal $\phi$ce to the high level. When activated, the X-address decoder XAD decodes the internal address signals ax0 to axp and alternatively brings the word line corresponding to the result of the decoding to a select state which is defined by a high level. When either the redundant word line Wr0 or Wr1 is brought into a select state by the redundant address changing circuit RAC (described later), the decoding operation of the X-address decoder XAD is suspended.

The redundant address changing circuit RAC includes two defective address ROMs and two address comparators, which are provided in correspondence with the redundant word lines Wr0 and Wr1 in the memory array MARY, although not necessarily limitative thereto. Each defective address ROM is, although not necessarily limitative, constituted by p+1 fuse means to hold the row address of a defective word line in the memory array MARY which has been allotted to the corresponding redundant word line Wr0 to Wr1. Each address comparator makes a comparison between the internal address signals ax0 to axp supplied from the X-address buffer XAB and the defective address stored in the associated defective address ROM. If all the bits of the two addresses are coincident with each other as a result of the comparison, the address comparator brings the corresponding redundant word line Wr0 or Wr1 to a select state which is defined by a high level. As described above, when the redundant word line Wr0 or Wr1 is raised to the high level, the decoding operation of the X-address decoder XAD is suspended. Thus, a word line which has been detected being defective is automatically changed over to the redundant word line Wr0 or Wr1.

The X-address buffer XAB receives and holds some of the low-order address signals A0 to Ai supplied from the central processing unit CPU through the address bus. The X-address buffer XAB forms the above-described address signals ax0 to axp on the basis of the address signals held thereby and supplies them to the X-address decoder XAD and the redundant address changing circuit RAC.

On the other hand, the n+1 pairs of complementary data lines that constitute the memory array MART are selectively connected to complementary common data lines CD and $\overline{CD}$ through a column switch CSW.

The column switch CSW includes n+1 pairs of switching MOSFETs which are provided in correspondence with the complementary data lines in the memory array MARY, although not necessarily limitative thereto. These switching MOSFETs are coupled at one end thereof to the corresponding complementary data lines in the memory array MARY and mutually coupled at the other end to the non-inverted and inverted signal lines constituting the complementary common data lines CD and $\overline{CD}$. The gates of each pair of switching MOSFETs are mutually coupled and supplied with the corresponding one of the data line select signals Y0 to Yn supplied from a Y-address decoder YAD.

The switching MOSFETs of the column switch CSW are selectively turned ON when the corresponding data line select signals Y0 to Yn are alternatively raised to the high level, thereby selectively connecting together the corresponding complementary data lines in the memory array MARY and the complementary common data lines CD and $\overline{CD}$.

The Y-address decoder YAD is, although not necessarily limitative, supplied with q+1-bit internal address signals ay0 to ayq from a Y-address buffer YAB and also with the above-described timing signal $\phi$ce from the timing generator TG.

The Y-address decoder YAD is selectively activated in response to the rise of the timing signal $\phi$ce to the high level. When activated, the Y-address decoder YAD decodes the internal address signals ay0 to ayq and alternatively raises to the high level the one of the data line select signals Y0 to Yn in accordance with the result of the decoding. These data line select signals are supplied to the corresponding switching MOSFETs, respectively, of the column switch CSW, as described above.

The Y-address buffer YAB receives and holds the rest of the address signals A0 to Ai. The Y-address buffer YAB forms the above-described internal address signals ay0 to ayq on the basis of the address signals held thereby and supplies them to the Y-address decoder YAD.

The complementary common data lines CD and $\overline{CD}$ are coupled to a data input/output circuit I/O. The data input/output circuit I/O includes a data input buffer and a data output buffer, although not necessarily limitative thereto.

The input terminal of the data input buffer in the data input/output circuit I/O is coupled to the data input bus Din, while the output terminal thereof is coupled to the complementary common data lines CD and $\overline{CD}$. The data input buffer is supplied with a timing signal $\phi$we from the timing generator TG. The timing signal $\phi$we is, although not necessarily limitative, normally at the low level and temporarily raised to the high level at a predetermined timing when the corresponding unit memory integrated circuit is brought into a select state in the write mode.

The data input buffer of the data input/output circuit I/O is selectively activated in response to the rise of the timing signal $\phi$we to the high level. When activated, the data input buffer takes in and holds write data supplied through the data input bus Din. Further, the data input buffer forms a complementary write signal on the basis of the write data and supplies it to a memory cell selected in the memory array MARY through the complementary common data lines CD and $\overline{CD}$.

The input terminal of the data output buffer in the data input/output circuit I/O is coupled to the complementary common data lines CD and $\overline{CD}$, while the output terminal thereof is coupled to the data output buffer Dout. The data output buffer is supplied with a timing signal $\phi$oe from the timing generator TG. The timing signal $\phi$oe is, although not necessarily limitative, normally at the low level and temporarily raised to the high level at a predetermined timing when the corresponding unit memory integrated circuit is brought into a select state in the read mode.

The data output buffer of the data input/output circuit I/O is selectively activated in response to the rise of the timing signal $\phi$oe to the high level. When activated, the data output buffer amplifies a readout signal output from a memory cell selected in the memory array MARY through the complementary common data lines CD and $\overline{CD}$ and delivers the amplified readout signal to the data output bus Dout. When the timing signal $\phi$oe is at the low level, the output of the data output buffer is placed in a high-impedance state.

The timing generator TG is supplied with the corresponding device select signals DS0 to DSs from the memory control circuit UMC and also with a write enable signal $\overline{WE}$ from the central processing unit CPU. The timing generator TG forms the above-described various timing signals on the basis of the device select signals DS0 to DSs and the write enable signal $\overline{WE}$ and supplies them to the various circuits.

Figure 10:
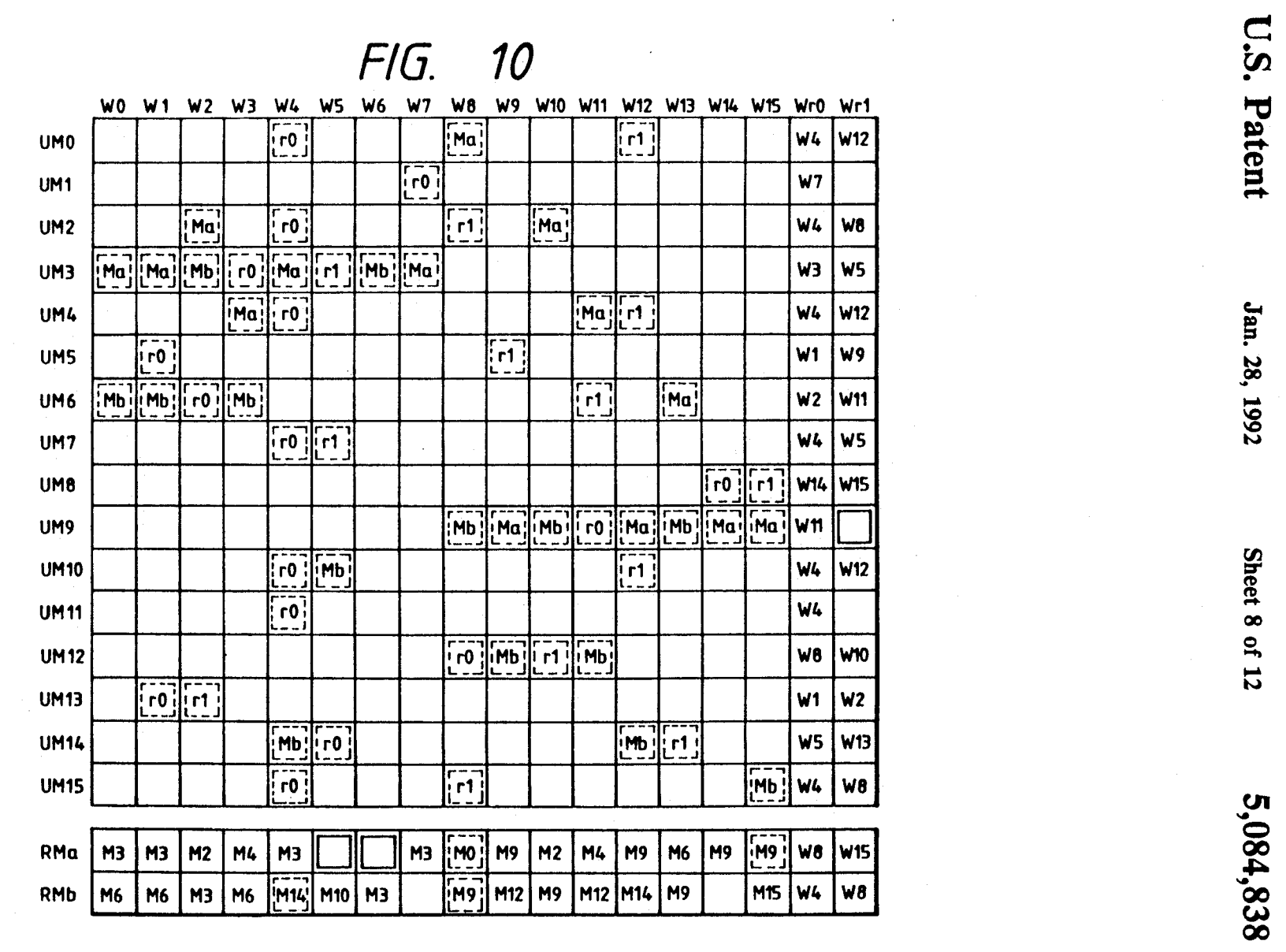

FIG. 10 is a chart exemplarily showing the way in which redundant elements are allotted in the memory unit MU shown in FIG. 7. In the figure, it is assumed with a view to facilitating understanding of the description that the number s+1 of unit memory integrated circuits is 16 and the number m+1 of word lines in each unit memory integrated circuit is similarly 16. In each unit memory integrated circuit, word lines which have been detected being defective are denoted by solid-line squares, respectively. Among the defective word lines, those which have been relieved by means of the corresponding redundant word lines or redundant memory integrated circuits are denoted by chain-line squares in place of the solid-line squares, and the substituting redundant word lines or redundant memory integrated circuits are entered therein with reference symbols such as r0, r1 or Ma, Mb. In the columns of the redundant word lines and the word lines in the redundant memory integrated circuits RMa and RMb, the Nos. of unit memory integrated circuits which have been relieved thereby, e.g., M0 to M15, are entered. The outline of the method of allotting redundant elements in the memory unit MU of this embodiment will be explained below with reference to FIG. 10.

Referring to FIG. 10, each of the unit memory integrated circuits UM0 to UM15 includes 16 word lines W0 to W15 and two redundant word lines Wr0 and Wr1. Among them, the redundant word lines Wr0 and Wr1 can be allotted to any desired defective word lines in the corresponding unit memory integrated circuit as being first redundant elements, as described above.

Similarly, each of the redundant memory integrated circuits RMa and RMb includes 16 word lines W0 to W15 and two redundant word lines Wr0 and Wr1. Among them, the redundant word lines Wr0 and Wr1 can be allotted to any defective word lines in the corresponding redundant memory integrated circuit in the same way as in the case of the above-described unit memory integrated circuits. The word lines W0 to W15 in the redundant memory integrated circuits RMa and RMb can be allotted as being second redundant elements to defective word lines, respectively, in any unit memory integrated circuits which are detected being defective at the corresponding addresses.

It should be noted that in the example shown in FIG. 10 a relatively large number of defective word lines are detected in the unit memory integrated circuits UM3, UM6 and UM9 and a relatively large number of defective devices are detected at the row addresses corresponding to the word lines W4, W8 and W12.

In the memory unit MU of this embodiment, the first redundant elements, that is, the redundant word lines Wr0 and Wr1 in each unit memory integrated circuit, and the second redundant elements, that is, the word lines in the redundant memory integrated circuits RMa and RMb, are effectively allotted so that the validity rate of the unit memory interated circuits, i.e., the number of available unit memory integrated circuits, as viewed from each address of the memory unit is 16, that is, all the addresses in all the unit memory integrated circuits are validated by the defect relief, although not necessarily limitative thereto, as follows:

(1) In order to effectively unitilize the redundant word lines Wr0 and Wr1 in each unit memory integrated circuit, the redundant word lines Wr0 and Wr1 are successively allotted to defective word lines, respectively, in unit memory integrated circuits in which the number of word lines which have been detected being defective is two or less, e.g., the unit memory integrated circuits UM1, UM5, UM7, UM8, UM11 and UM13.

(2) Word lines in the redundant memory integrated circuits RMa and RMb for which the number of unit memory integrated circuits left unrelieved at the corresponding addresses results in two or less, e.g., W0, W1, W6, W7, W9, W14 and W15, are successively allotted to the defective devices at the corresponding addresses.

(3) Next, in a unit memory integrate circuit in which the number of defective word lines left unrelieved after the defect relief processings described in (1) and (2) is two or less, e.g., in the unit memory integrated circuit UM 15, the redundant word lines Wr0 and Wr1 are successively allotted to the respective defective word lines.

(4) Word lines in the redundant memory integrated circuits RMa and RMb for which the number of unit memory integrated circuits left unrelieved at the corresponding addresses results in two or less (there is no applicable word line in the example shown in FIG. 4) are successively allotted to the defective devices at the corresponding addresses.

(5) The defect relief processings described in (3) and (4) are repeated until there is no applicable unit memory integrated circuit or row address.

(6) The remaining redundant word lines Wr0 and Wr1 in the unit memory integrated circuits are allotted preferentially and in trial and error manner to word lines corresponding to row addresses at which the number of unrelieved defective devices is particularly large, e.g., the word lines W4, W8 and W12.

(7) The defect relief processing described in (3) and those thereafter are repeated until there is no defect word line.

As will be clear from FIG. 10, by carrying out the defect relief processings described in (1) to (7), the redundant word lines and redundant memory integrated circuits can be effectively allotted despite the fact that the number of defective word lines exceeds the number of redundant word lines provided in each unit memory integrated circuit particularly in the unit memory integrated circuits UM3, UM6 and UM9 and the number of defective devices exceeds the number of word lines in the redundant memory integrated circuits at the addresses corresponding to the word lines W4, W8 and W12, so that the word lines W0 to W15 in all the unit memory integrated circuits UM0 to UM15 are validated. Thus, it is possible to increase the packaging density and product yield of the memory unit MU and lower the production cost.

As has been described above, the memory unit MU of this embodiment is fabricated in the form of a so-called wafer scale memory and includes a multiplicity of unit memory integrated circuits formed on a single wafer. In this embodiment, each unit memory integrated circuit is provided with first redundant elements, that is, the redundant word lines Wr0 and Wr1, which can be allotted to any desired addresses, respectively, and assemblies of second redundant elements which can be allotted to the corresponding addresses in any desired unit memory integrated circuit, that is, the redundant memory integrated circuits RMa and RMb, are provided in correspondence with the addresses in the unit memory integrated circuits. These redundant elements are allotted according to a predetermined algorithm so that the validity rate of the unit memory integrated circuits at every row address is above a predetermined value. As a result, in the memory unit MU of this embodiment the validity rates for all the row addresses are made uniform and all elements which are judged to be normal can be effectively utilized despite the fact that the number of defects occurring in each unit memory integrated circuit exceeds the number of redundant word lines provided therefor and the number of defects occurring per row address exceeds the number of word lines provided in the redundant memory integrated circuits. Thus, it is possible to increase the product yield and packaging density of the memory unit MU and promote lowering in the production cost.

As will be clear from the foregoing description of this embodiment, application of the present invention to a semiconductor memory device, e.g., a memory unit that employs a wafer scale memory, provides the following advantages:

(1) A wafer scale memory or the like which includes a plurality of unit memory integrated circuits is provided with first redundant elements which are prepared for each unit memory integrated circuit so as to be capable of being allotted to any desired addresses in the corresponding unit memory integrated circuit and second redundant elements which are provided in correspondence with the respective addresses in the unit memory integrated circuits so as to be capable of being allotted to the corresponding addresses in any desired unit memory integrated circuit, and the first and second redundant elements are allotted so that the validity rate of the unit memory integrated circuits at every address is above a predetermined value. Thus, it is possible to effectively utilize normal elements in all the unit memory integrated circuits mounted on a wafer scale memory or the like.

(2) By virtue of the advantage (1), it is possible to make uniform and substantially increase the validity rates of unit memory integrated circuits at all the addresses in a wafer scale memory or the like.

(3) By virtue of the advantages (1) and (2), it is possible to increase the product yield and packaging density of a wafer scale memory or the like.

(4) By virtue of the advantages (1) to (3), it is possible to promote lowering in the production cost of a wafer scale memory or the like which includes a multiplicity of unit memory integrated circuits.

Although the invention accomplished by the present inventions has been described specifically by way of one embodiment, it should be noted that the present invention is not necessarily limitative to the described embodiment and that various changes and modifications may be imparted thereto without departing from the gist and scope of the invention. For instance, although in the foregoing embodiment the redundant memory integrated circuits RMa and RMb are handled separately from the other unit memory integrated circuits UM0 to UMs, they are substantially the same as the unit memory integrated circuits and therefore may be formed by utilizing some of the unit memory integrated circuits mounted on a wafer scale memory or the like. Although in the described embodiment the defect relief processing is carried out with respect only to the word lines in each unit memory integrated circuit, a similar relief method may be adopted for the complementary data lines. Although in the foregoing embodiment the memory control circuit UMC and the redundant control memory RCM are provided separately from the unit memory integrated circuits UM0 to UMs, the functions of the memory control circuit UMC and the redundant control memory RCM may be dispersed, for example, by providing a combination of device code decoder, EPROM and address comparator in each of the unit memory integrated circuits and redundant memory integrated circuits. In this case, the arrangement may, for example, be such that in each unit memory integrated circuit the output of the device code decoder is selectively invalidated in accordance with the output of the address comparator and, at the same time, the output of the device code decoder in the corresponding redundant memory integrated circuit is selectively validated.

In FIG. 7, the redundant control memory RCM may be formed using, for example, an associative memory constituted by an erasable and programmable read only memory. The memory unit MU may be arranged such that it is possible to simultaneously input and output storage data consisting of a plurality of bits. The data input bus Din and the data output bus Dout may be arranged in the form of a common data bus. The number of redundant word lines provided in each unit memory integrated circuit and the number of redundant memory integrated circuits may be set as desired in correspondence with the rate of incidence of defects or the validity rate of unit memory integrated circuits ultimately required. In this case, the memory control circuit UMC shown in FIG. 8 needs to include a number of address comparators which corresponds to the number of redundant memory integrated circuits installed. In FIG. 9, the memory array MARY may be constituted by a plurality of memory mats. In this case, the X-address decoder XAD and the Y-address decoder YAD may be shared among a plurality of memory mats. In FIG. 10, allotment of redundant elements may be carried out in another way. For example, relief of defective elements executed in correspondence with the addresses may be ahead of that for the unit memory integrated circuits. It is also possible to adopt any desired algorithm. In addition, various changes and modifications may be imparted to various constituent elements, for example, the block arrangement of the memory unit MU shown in FIG. 7, the block arrangements of the memory control circuit and unit memory integrated circuits shown in FIGS. 8 and 9, and the combination of addresses and control signals.

Although the invention accomplished by the present inventors has been described mainly by way of an example in which the present invention is applied to a wafer scale memory which belongs to the applicable field of the invention, it should be noted here that the present invention is not necessarily limitative thereto and that it may also be applied to multi-chip modules and other large-scale memory integrated circuits. The present invention may be widely applied to semiconductor memory devices each including a plurality of unit memory integrated circuits and digital devices including such a semiconductor memory device.

Embodiment 3

Figure 11:
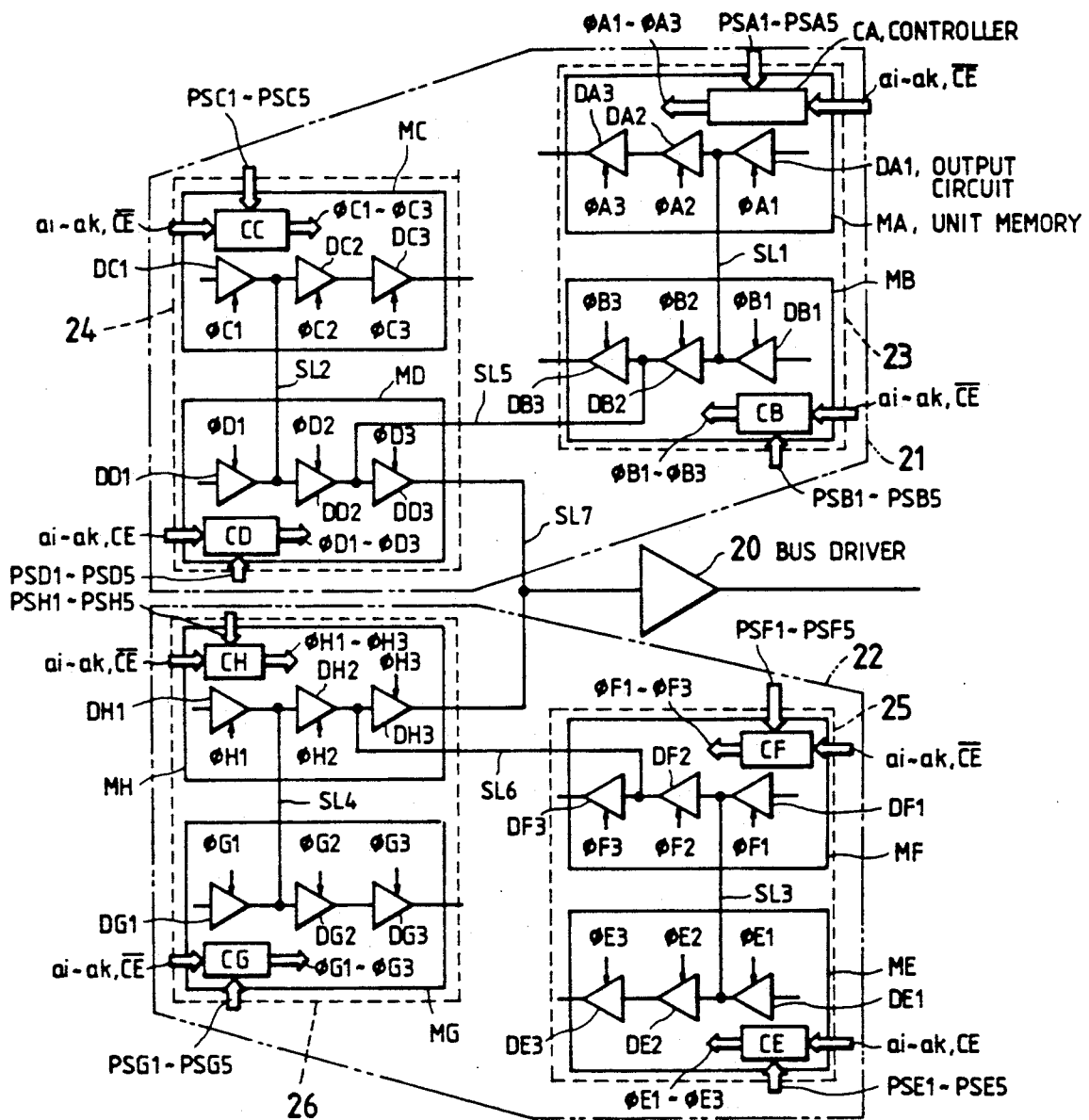
FIG. 11 is a block diagram of a part of a wafer scale memory to which the present invention is applied, which shows a third embodiment of the present invention.

FIG. 11 is a block diagram of a part of a wafer scale memory to which the present invention is applied, which shows a third embodiment of the present invention. The wafer scale memory shown in the figure is formed on a single semiconductor substrate such as a silicon substrate by the use of known semiconductor integrated circuit manufacturing technology.

The wafer scale memory shown in FIG. 11 includes eight unit memories MA to MH each constituted by a RAM (Random Access Memory), although not necessarily limitative thereto. In each of the unit memories MA to MH, an output buffer for 1 bit is representatively shown. Each output buffer has three output circuits DA1 to DA3 . . . DH1 to DH3 which are series-connected in three stages, although not necessarily limitative thereto.

Figure 12:
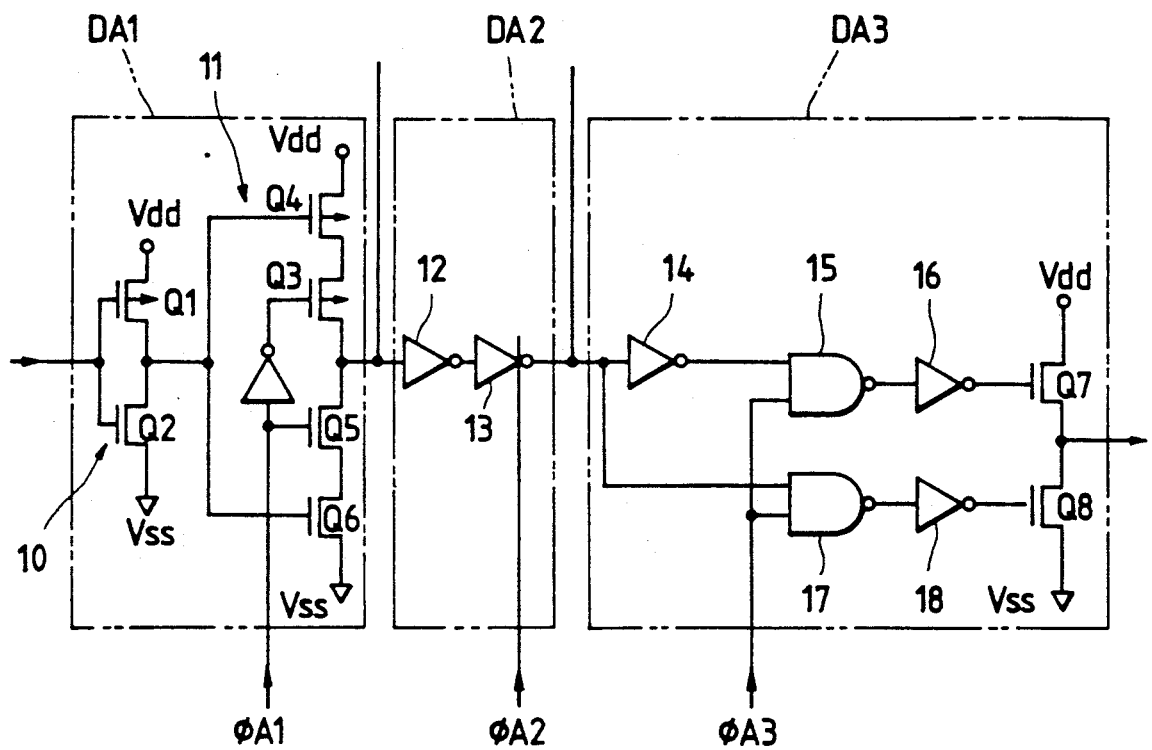
FIG. 12 is a circuit diagram showing one example of an output buffer or a unit memory shown in FIG. 11 which is formed by series-connecting output circuits in three stages.

FIG. 12 shows one example of the set of output circuits DA1 to DA3 included in the unit memory MA.

The first-stage output circuit DA1 comprises a complementary MOS (hereinafter referred to as simply "CMOS") inverter 10 and a CMOS clocked inverter 11 which is seires-connected thereto, although not necessarily limitative thereto. The CMOS inverter 10 comprises a p-channel MOSFET Q1 and an n-channel MOSFET Q2 which are connected together in push-pull complementary form. The CMOS clocked inverter 11 comprises a pair of p-channel MOSFETs Q3 and Q4 and a pair of n-channel MOSFETs Q5 and Q6, which are series-connected between power supply terminals Vdd and Vss, the gate electrodes of the MOSFETs Q4 and Q6 being mutually coupled to the output terminal of the CMOS inverter 10. Further, the gate electrode of the MOSFET Q5 is supplied with an output control signal $\phi A1$, while the gate electrode of the MOSFET Q3 is supplied with a signal obtained by inverting the output control signal $\phi A1$. When the output control signal $\phi A1$ is at the low level, the output circuit DA1 assumes a high-output impedance state, whereas, when the output control signal $\phi A1$ is at the high level, the output circuit DA1 gives the subsequent stage an output level corresponding to the level of the input signal.

Similarly, the second-stage output circuit DA2 comprises a CMOS inverter 12 and a CMOS clocked inverter 13 which are series-connected to each other. When the output control signal $\phi A2$ that is supplied to the CMOS clocked inverter 13 is at the low level, the output circuit DA2 assumes a high-output impedance state, whereas, when the output control signal $\phi A2$ is at the high level, the output circuit DA2 gives the subsequent stage an output level corresponding to the level of the input signal.

The third-stage output circuit DA3 has an output stage comprising a pair of n-channel MOSFETs Q7 and Q8 which are series-connected between power supply terminals Vdd and Vss to obtain a TTL output, although not necessarily limitative thereto. The output circuit DA3 is further provided with, as output control logics with respect to the output stage, a CMOS inverter 14 for inverting the output of the output circuit DA2, a NAND gate 15 supplied with two inputs, that is, the output of the CMOS inverter 14 and an output control signal $\phi A3$, a CMOS inverter 16 which inverts the output of the NAND gate 15 and gives it to the gate electrode of the MOSFET Q7, a NAND gate 17 supplied with two inputs, that is, the output of the output circuit DA2 and the output control signal $\phi A3$, and a CMOS inverter 18 which inverts the output of the NAND gate 17 and gives it to the gate electrode of the MOSFET Q8, although not necessarily limitative thereto. The output circuit DA3 is controlled such that, when the output control signal $\phi A3$ is at the low level, both the MOSFETs Q7 and Q8 are OFF and therefore the output circuit DA3 assumes a high-output impedance state, whereas, when the output control signal $\phi A3$ is at the high level, the output circuit DA3 outputs a high or low level which is conformable to TTL in accordance with the level of the input signal.

It should be noted that the output circuits DB1 to DB3 . . . DH1 to DH3 which are included in the other unit memories MB to MH are arranged in the same way as shown in FIG. 12.

In the output bus arrangement of the unit memories MA to MH which has three series-connected output circuits as described above, eight unit memories MA to MH are hierarchically connected in such a manner that, as exemplarily shown in FIG. 11, the set of a plurality of unit memories MA to MH is divided into blocks each constituted by a smaller set of unit memories and the outputs of all the unit memories MA to MH are given directly and indirectly to a bus driver 20 serving as a common output circuit with such a relation that the output of a predetermined unit memory included each set of unit memories divided into blocks is input to an output circuit in another unit memory and the output of this unit memory is utilized as an output common to the unit memories included in the same set.

More specifically, according to this embodiment, the eight unit memories MA to MH are roughly divided into two blocks, that is a first primary block 21 including four unit memories MA to MD and a second primary block 22 including four unit memories ME to MH. The first primary block 21 is subdivided into a first secondary block 23 including two unit memories MA, MB and a second secondary block 24 including two unit memories MC, MD. The second primary block 22 is subdivided into a third secondary block 25 including two unit memories ME, MF and a fourth secondary block 26 including two unit memories MG, MH.

In each of the secondary blocks, the output terminal of the first-stage output circuit in one unit memory included therein is coupled to the input terminal of the second-stage output circuit included in the other unit memory. More specifically, in the first secondary block 23 the output terminal of the output circuit DA1 is coupled to the input terminal of the output circuit DB2 through a signal line SL1. Similarly, the output terminal of the output circuit DC1 in the second secondary block 24 is coupled to the input terminal of the output circuit DD2 through a signal line SL2, while the output terminal of the output circuit DE1 in the third secondary block 25 is coupled to the input terminal of the output circuit DF2 through a signal line SL3, and the output terminal of the output circuit DG1 in the fourth secondary block 26 is coupled to the input terminal of the output circuit DH2 through a signal line SL4.

In each primary block, the output terminals of the second-stage output circuits that are utilized in common to the secondary blocks included therein are coupled to each other. More specifically, in the first primary block 21, the output terminal of the output circuit DB2 and the output terminal of the output circuit DD2 are connected together through a signal line SL5. Similarly, the output terminal of the output circuit DF2 in the second primary block 21 is connected to the output terminal of the output circuit DH2 through a signal line SL6.

Further, the output terminals of the third-stage output circuits DD3 and DH3 that are utilized in common to the respective sets of four unit memories included in the respective primary blocks 21 and 22 are coupled to the input terminal of the bus driver 20 through a signal line SL7.

Figure 13:
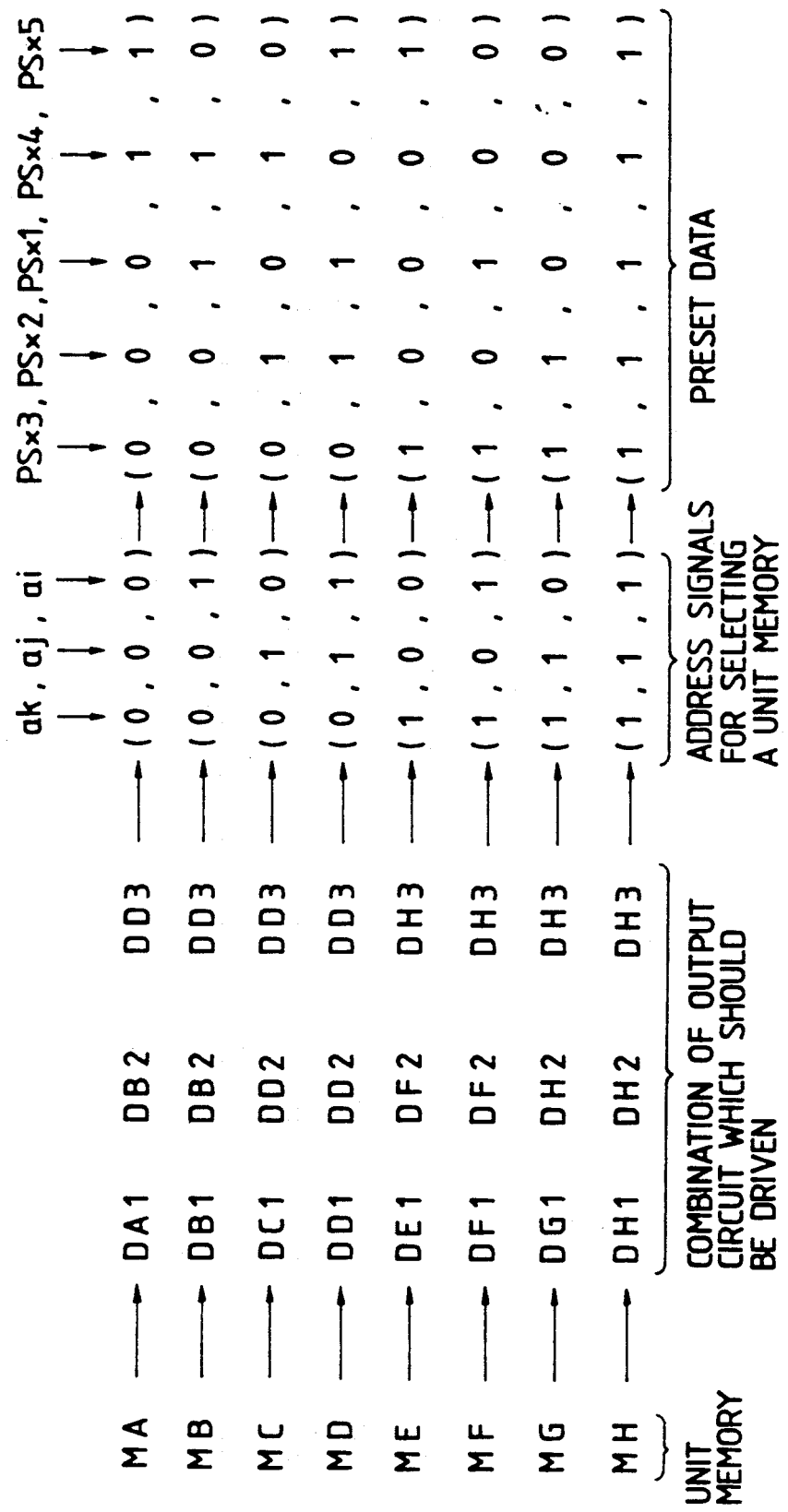
FIG. 13 exemplarily shows the combinations of output circuits which should be driven in an output operation of a desired one of the unit memories shown in FIG. 11 and the bit patterns of preset data.

In such a hierarchical connection of eight unit memories MA to MH, to supply data read out, for example, from the unit memory MA to the bus driver 20, the first-stage output circuit DA1 included in the unit memory MA, the second-stage output circuit DB2 included in the unit memory MB and the third-stage output circuit DD3 included in the unit memory MD are each activated to perform an output operation. FIG. 13 shows combinations of output circuits which should be driven in connection with the output operations of the other unit memories.

The selection of output circuit operations is controlled in accordance with the combinations shown in FIG. 13 by control circuits CA to CH which are incorporated in the respective unit memories, although not necessarily limitative thereto.

The control circuits CA to CH are supplied with 3-bit address signals ai to ak for designating a given one of the eight unit memories MA to MH, separately from address signals for directly addressing memory cells (not shown). The bit ak is regarded as a bit indicating whether the first primary block 21 or the second primary block 22 should be selected, while the bit aj is regarded as a bit indicating which one of the two secondary blocks included in one primary block should be selected, and the bit ai is regarded as a bit indicating which one of the two unit memories included in one secondary block should be selected. FIG. 13 exemplarily shows combinations of 3-bit address signals ai to ak in the case where any desired unit memory is to be selected from the eight unit memories MA to MH.

Figure 14:
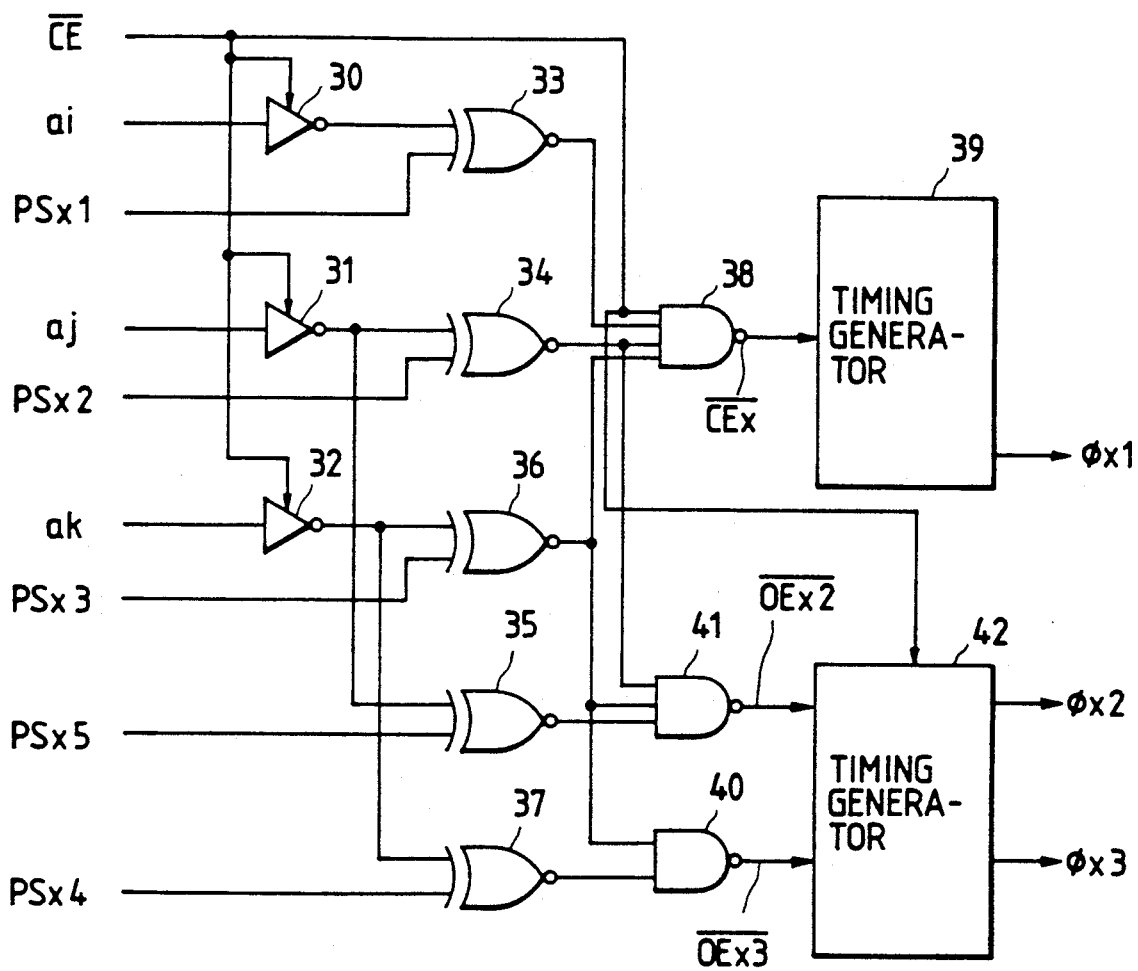
FIG. 14 is a circuit diagram showing one example of a logic arrangement for effecting operation selection of the unit memories and output circuits shown in FIG. 11.

FIG. 14 shows one example of the logic arrangement for realizing combinations of output circuits which should be driven, such as those shown in FIG. 13, when one unit memory is to be selected in accordance with the address signals ai to ak. The illustrated logic arrangement is included in each of the control circuits CA to CH. It should be noted that the symbol x denotes A to H.

In the logic arrangement shown in FIG. 14, address buffers 30 to 32 which are supplied with 3-bit address signals ai to ak output the respective input address signals ai to ak to the subsequent stage when a chip enable signal $\overline{CE}$ for designating selection of the general operation of the wafer scale memory is asserted to the low level.

The bit ai that is supplied from the address buffer 30 is compared with preset data PSx1 in an exclusive-NOR gate (hereinafter referred to as simply "ENOR") 33. When the two data are coincident with each other, the ENOR 33 outputs a high-level signal. Similarly, the bit aj that is supplied from the address buffer 31 is compared with preset data PSx2 and PSx5 in ENORs 34 and 35, respectively. When the two data are coincident with each other, each of the ENORs 34 and 35 outputs a high-level signal. The bit ak that is supplied from the address buffer 32 is compared with preset data PSx3 and PSx4 in ENORs 36 and 37, respectively. When the two data are coincident with each other, each of the ENORs 36 and 37 outputs a high-level signal.

The outputs of the ENORs 33, 34 and 36 and the chip enable signal CE are supplied to 4-input NAND gate 38. The NAND gate 38 is a circuit for forming a chip enable signal $\overline{CEx}$ for a unit memory Mx. When all the four inputs are at the high level, the NAND gate 38 asserts the chip enable signal $\overline{CEx}$ to the low level and supplies it to a timing generator 39. In response to this, the timing generator 39 controls the inside of the unit memory Mx so as to be brought into an operative state and supplies various control signals and timing signals thereto. The internal control signals include the output control signal $\phi x1$ for the first-stage output circuit Dx1. When the operation of the unit memory Mx is designated by the chip enable signal $\overline{CEx}$, the output control signal $\phi x1$ is controlled so as to rise to the high level in synchronism with the output timing of data determined on the basis of the assert timing of the chip enable signal $\overline{CEx}$.

The control of the third-stage output circuit Dx3 included in each unit memory Mx to constitute the final output stage is effected on the basis of an output enable signal $\overline{OEx3}$ from a NAND gate 40 supplied with two inputs, that is, the outputs of the ENORs 36 and 37. The control of the second-stage output circuit Dx2 included in each unit memory Mx is effected on the basis of an output enable signal $\overline{OEx2}$ from a NAND gate 41 which is supplied with three inputs, that is, the outputs of the ENORs 34 to 36.

When both the two inputs supplied thereto are at the high level, the NAND gate 40 asserts the output enable signal $\overline{OEx3}$ to the low level and supplies it to the timing generator 42. In response to this, the timing generator 42 controls the output control signal $\phi x3$ so as to rise to the high level in synchronism with the output timing of data determined on the basis of the assert timing of the chip enable signal $\overline{CE}$, irrespective of whether or not the operation of the unit memory Mx concerned is selected by the chip enable signal $\overline{CEx}$, thereby bringing the third-stage output circuit Dx3 into an operative state.

When all the three inputs supplied thereto are at the high level, the NAND gate 41 asserts the output enable signal $\overline{OEx2}$ to the low level and supplies it to the timing generator 42. In response to this, the timing generator 42 controls the output control signal $\phi x2$ so as to rise to the high level in synchronism with the output timing of data determined on the basis of the assert timing of the chip enable signal $\overline{CE}$, irrespective of whether or not the operation of the unit memory Mx concerned is selected by the chip enable signal $\overline{CEx}$, thereby bringing the second-stage output circuit Dx2 into an operative state.

The preset data PSx1 to PSx5 are used as data for realizing a combination of three output circuits which should be driven when the operation of a desired unit memory is selected as shown in FIG. 13. Bit patterns of the preset data PSx1 to PSx5 which are set in correspondence with unit memories which should be selected are shown in FIG. 13.

Setting of the preset data PSx1 to PSx5 are, although not necessarily limitative, effected in such a manner that a bit which is to be set to data "0" is pulled down, while a bit which is to be set to data "1" is pulled up. The program processing of the preset data PSx1 to PSx5 by pull-up and pull-down may be effected on the wafer scale memory chip in the wiring step that utilizes the aluminum master slicing method or a method of fusing program links, for example, fuses, or may also be effected outside the chip.

One example of the operation of the foregoing embodiment will next be explained.

When the output operation of a unit memory MA, for example, is selected, the chip enable signal $\overline{CE}$ that is supplied to each of the unit memories MA to MH is shifted to the low level and the 3-bit address signals ai, aj and ak are set to 0, 0 and 0, respectively.

Since, among the preset data PSx1, PSx2 and PSx3 set in each of the unit memories MA to MH, only the preset data PSA1, PSA2 and PSA3 corresponding to the unit memory MA have been set to 0, 0 and 0, respectively, only the chip enable signal $\overline{CEA}$ for the unit memory MA is asserted to the low level, thus the operation of the unit memory MA concerned being selected.

Data read out from the unit memory MA the operation of which is selected is given to the bus driver 20 through the output circuit DA1 included in the unit memory MA concerned, the output circuit DB2 included in the unit memory MB and the output circuit DD3 included in the unit memory MD.

More specifically, when the chip enable signal $\overline{CEA}$ is asserted and the output control signal $\phi A1$ is asserted at the data output timing, the readout data is supplied to the output circuit DB2 in the unit memory MB through the signal line SL1. Since at this time the chip enable signals $\overline{CEB}$ to $\overline{CEH}$ in the other unit memories MB to MH are all negated, the first-stage output circuits DB1 to DH1 included in these unit memories MB to MH are all held in a high-output impedance state.

Since the preset data PSB5 for the unit memory MB has been set to "0", the ENOR 35 in the unit memory MB judges that the preset data PSB5, i.e., "0", is coincident with the bit aj "0" and delivers a high-level output and the ENORs 34 and 36 in the unit memory MB also deliver high-level outputs, respectively, resulting in the output enable signal $\overline{OEB2}$ being asserted to the low level. Thus, the output circuit DB2 included in the unit memory MB drives the signal line SL5 on the basis of data given through the signal line SL1, and the drive signal is given to the third-stage output circuit DD3 included in the unit memory MD. Since in this case the NAND gate 41 included in each unit memory to form the output enable signal $\overline{OEx2}$ is supplied with three inputs, that is, the output of the ENOR 35 which judges whether or not the preset data PSx5 and the bit aj are coincident with each other, the output of the ENOR 34 which judges whether or not the preset data PSx2 and the bit aj are coincident with each other and the output of the ENOR 36 which judges whether or not the preset data PSx3 and the bit ak are coincident with each other, the output enable signals $\overline{OEA2}$, $\overline{OEC2}$ to $\overline{OEH2}$ in the other unit memories MA and MC to MH are all negated, so that the second-stage output circuits DA2 and DC2 to DH2 included in the unit memories MA and MC to MH are all held in a high-output impedance state.

Further, since the preset data PSD4 for the unit memory MD has been set to "0", the ENOR 37 in the unit memory MD judges that the preset data PSD4, i.e., "0" is coincident with the bit ak "0" and delivers a high-level output and the ENOR 36 in the unit memory MD also delivers a high-level output, resulting in the output enable signal $\overline{OED3}$ being asserted to the low level. Thus, the output circuit DD3 included in the unit memory MD drives the signal line SL7 on the basis of data given through the signal line SL5, and the drive signal is given to the bus driver 20 to output data to the outside. Since in this case the NAND gate 40 included in each unit memory to form the output enable signal $\overline{OEx3}$ is supplied with two inputs, that is, the output of the ENOR 37 which judges whether or not the preset data PSx4 and the bit ak are coincident with each other and the output of the ENOR 36 which judges whether or not the preset data PSx3 and the bit ak are coincident with each other, the output enable signals $\overline{OEA3}$ to $\overline{OEC3}$ and $\overline{OEE3}$ to OEH3 in the other unit memories MA to MC and ME to MH are all negated, so that the third-stage output circuits DA3 to DC3 and EE3 to DH3 included in the unit memories MA to MC and ME to MH are all held in a high-output impedance state.

Thus, data that is obtained from the unit memory MA the operation of which is selected is given to the outside through the bus driver 20 by the operations of the output circuits DA1, DB2 and DD3 included in the unit memories MA, MB and MD, respectively: the output circuit DA1 drives the signal line SE1; the output circuit DB2 receiving the signal through the signal line SL1 drives the signal line SL5; and the output circuit DD3 receiving the signal through the signal line SL5 drives the signal line SL7.

The following is a description of the operation taking place when the output operation of the unit memory MD is selected. At this time, 3-bit address signals ai, aj and ak which are supplied to each of the unit memories MA to MH are set to 1, 1 and 0, respectively. Since, among the preset data PSx1, PSx2 and PSx3 set for the unit memories MA to MH, only the preset data PSD1, PSD2 and PSD3 corresponding to the unit memory MD have been set to 1, 1 and 0, respectively, only the chip enable signal $\overline{CED}$ for the unit memory MD is asserted to the low level, thus the operation of the unit memory MD concerned being selected.

Data that is read out from the unit memory MD the operation of which is selected is given to the bus driver 20 through the output circuits DD1, DD2 and DD3 included in the unit memory MD.

More specifically, when the chip enable signal $\overline{CED}$ is asserted and the output control signal $\phi$D1 is asserted at the data output timing, the readout data is given from the output circuit DD1 to the subsequent output circuit DD2.

Since the preset data PSD5 for the unit memory MD has been set to "1", the ENOR 35 in the unit memory MD judges that the preset data PSD5, i.e., "1", is coincident with the bit aj "1" and delivers a high-level output and the ENORs 34 and 36 in the unit memory MD also deliver high-lever outputs, respectively, resulting in the output enable signal $\overline{OED2}$ being asserted to the low level. Thus, the output circuit DD2 included in the unit memory MD takes in data given from the output circuit DD1 in the previous state and gives its output to the output circuit DD3 in the final stage. Since in this case the NAND gate 41 included in each unit memory to form the output enable signal $\overline{OEx2}$ is supplied with three inputs, that is, the output of the ENOR 35 which judges whether or not the preset data PSx5 and the bit aj are coincident with each other, the output of the ENOR 34 which judges whether or not the preset data PSx2 and the bit aj are coincident with each other and the output of the ENOR 36 which judges whether or not the preset data PSx3 and the bit ak are coincident with each other, the output enable signals $\overline{OEA2}$ to $\overline{OEC2}$ and $\overline{OEE2}$ to $\overline{OEH2}$ in the other unit memories MA to MC and ME to MH are all negated, so that the second-stage output circuits DA2 to DC2 and DE2 to DH2 included in the unit memories MA to MC and ME to MH are all held in a high-output impedance state.

Further, since the preset data PSD4 for the unit memory MD has been set to "0", the ENOR 37 in the unit memory MD judges that the preset data PSD4, i.e., "0", is coincident with the bit ak "0" and delivers a high-level output and the ENOR 36 in the unit memory MD also delivers a high-level output, resulting in the output enable signal $\overline{OED3}$ being asserted to the low level. Thus, the output circuit DD3 included in the unit memory MD drives the signal line SL7 on the basis of data given from the output circuit DD2 in the previous stage, and the drive signal is given to the bus driver 20 to output data to the outside. Since in this case the NAND gate 40 included in each unit memory to form the output enable signal $\overline{OEx3}$ is supplied with two inputs, that is, the output of the ENOR 37 which judges whether or not the preset data PSx4 and the bit ak are coincident with each other and the output of the ENOR 36 which judges whether or not the preset data PSx3 and the bit ak are coincident with each other, the output enable signals $\overline{OEA3}$ to $\overline{OEC3}$ and $\overline{OEE3}$ to $\overline{OEH3}$ in the other unit memories MA to MC and ME to MH are all negated, so that the third-stage output circuits DA3 to DC3 and DE3 to DH3 included in the unit memories MA to MC and ME to MH are all held in a high-output impedance state.

Thus, data that is obtained from the unit memory MD the operation of which is selected is given to the three series-connected output circuits DDL to DD3 included in the unit memory MD concerned and given to the outside through the bus driver 20 by the operation of the output circuit DD3 in the final stage that drives the single signal line SL7.

The foregoing embodiment provides the following advantages:

(1) A plurality of unit memories MA to MH are divided into primary blocks 21 and 22 which are subdivided into secondary blocks 23 to 26, and the unit memories MA to MH are hierarchically connected so that the outputs of all the unit memories MA to MH are given directly and indirectly to the bus driver 20 with such a relation that the output of a predetermined unit memory included each set of unit memories divided into blocks is input to an output circuit in another unit memory and the output of this unit memory is utilized as an output common to the unit memories included in the same set. Accordingly, a signal line for giving the output of a desired unit memory to the bus driver 20 is comprised of sections connected together through output circuits included in each unit memory within the same stratum and between different strata and there is no need for a signal line common to all the unit memories. Thus, the signal line load, i.e., wiring resistance and parasitic capacitance, which should be driven by one output circuit included in each unit memory becomes smaller than in the case of the conventional common signal line. Accordingly, it is possible to minimize the delay in propagation of signals due to the resistance and capacitance components that are undesirably present in the signal line and achieve an increase in the speed of the operation of outputting data to the outside without the need to excessively increase the driveability of each individual output circuit.

(2) Since it is unnecessary to excessively increase the driveability of each individual output circuit, it is possible to prevent generation of unnegligible noise and aluminum migration.

(3) Since a signal line for giving the output of a desired unit memory to the bus driver 20 is comprised of sections connected together through output circuits included in each unit memory within the same stratum and between different strata and there is no need for a signal line common to all the unit memories, when the output operation of a unit memory which is closer to the bus driver 20 is selected, the number or overall length of signal lines which should be driven by the output circuit is reduced. For instance, when the output operation of the unit memory MB is selected, the signal lines SL5 and SL7 are driven, while the output operation of the unit memory MD is selected, the signal line SL7 alone is driven. Accordingly, the current needed to charge and discharge the signal lines in an operation of outputting data to the outside is reduced on the whole or with time, so that it is possible to achieve a lowering in the power consumption.

(4) By virtue, particularly, of the control logic function shown in FIG. 44, a large number of output circuits which are out of the data output path assume a high-output impedance state and it is therefore possible to prevent an unnegligible current from flowing through these output circuits.

(5) The unit memories MA to MH include respective control circuits CA to CH for designating the corresponding unit memories, and each of the control circuits CA to CH includes a logic for forming a chip enable signal CEx as being an operation select signal for the corresponding unit memory in accordance with address signals ai to ak supplied thereto and further forming control signals $\phi x1$ to $\phi x3$ which enable three series-connected output circuits to be selectively activated to perform an output operation in accordance with the address signals ai to ak so that, even in a unit memory the operation of which is not selected, the output of a unit memory the operation of which is selected can be led to the bus driver 20. Accordingly, it is unnecessary to provide outside the wafer scale memory a circuit such as an address decoder for effecting such operation selection of the unit memories and the output circuits.

(6) In particular, the logic arrangement in the above-described control circuit for effecting operation selection of the unit memories and the output circuits is determined by the programmed condition of preset data PSx1 to PSx5 which are compared bitwise with the addresses ai to ak supplied thereto. It is therefore possible to simplify the general logic arrangement for such operation selection and hence facilitate the general logic setting process.

(7) By virtue of the above-described advantages, it is possible to markedly increase the number of memory blocks which can be integrated in wafer scale memories having a tendency to decrease in the current capacity and increase in the wiring resistance, without impairing the capability of outputting data at high speed and low-power consumption characteristics.

Although the invention accomplished by the present inventors has been described specifically by way of one embodiment, it should be noted that the present invention is not necessarily limitative to the described embodiment and that various changes and modification may, of course, be imparted thereto without departing from the gist and scope of the invention.

Although in the foregoing embodiment the wafer scale memory comprises eight unit memories, the number of unit memories may be properly varied, and it is also possible to properly alter the technique of dividing unit memories into blocks and the logic arrangement for effecting operation selection of the unit memories and the output circuits in accordance with the change in the number of unit memories. The number of seires-connected output circuits provided in each individual unit memory may be changed. For instance, when the wafer scale memory comprises 16 unit memories, these unit memories may be divided into blocks such that a group of eight unit memories is defined as a primary block, a group of four unit memories included in each primary block is defined as a secondary block, and a pair of unit memories included in each secondary block is defined as a tertiary block.

In the case where a plurality of unit memories are hierarchically arranged, the logic arrangement for effecting operation selection of the unit memories and the output circuits is not necessarily limitative to the described arrangement that the logic arrangement is included in each individual unit memory. Such operation selection may be effected by a special-purpose control circuit which is provided externally. In such a case, however, it is necessary to take into consideration the disadvantage that it takes a great deal of time and labor to construct the logic in contrast to the arrangement in this embodiment wherein it is only necessary to set preset data.

The circuit configuration of output circuits that are seires-connected in a multiplicity of stages is not necessarily limitative to the described one wherein a TTL output is obtained in the final output stage. The circuit configuration of the output circuits in the previous stages is not necessarily limitative to the described one which employs CMOS circuits, either.

Among the logic arrangements in the foregoing embodiment that have been described in connection with FIG. 14, the logic arrangement for forming a chip enable signal CEx for each unit memory on the basis of the address signals ai to ak and the preset data PSx1 to PSx3 may be applied alone to a technique for selecting a desired unit circuit block such as a unit memory in a wafer scale memory, a memory board, etc. More specifically, each of a plurality of unit circuit blocks is provided with control means for making a bitwise comparison between address data for selecting a desired one of the unit circuit blocks and preset data and forming an operation select signal for selecting the operation of a desired unit circuit block on the basis of a logic which is determined in accordance with the programmed condition of the preset data.

Thus, it becomes unnecessary to provide a special circuit such as an address decoder outside each unit circuit block and it is possible to achieve simplification of the general logic arrangement for selecting the operation of a unit circuit block.

Although the invention accomplished by the present inventors has been described mainly by way of one example in which the present invention is applied to a wafer scale memory which belongs to the applicable field of the invention, it should be noted that the present invention is not necessarily limitative thereto and that it may also be applied to a memory board or other similar storage means. The present invention may be applied at least to devices which have a plurality of unit circuit blocks such as unit memory blocks and wherein a desired one of the unit circuit blocks is selected to operate.

Figure 15:
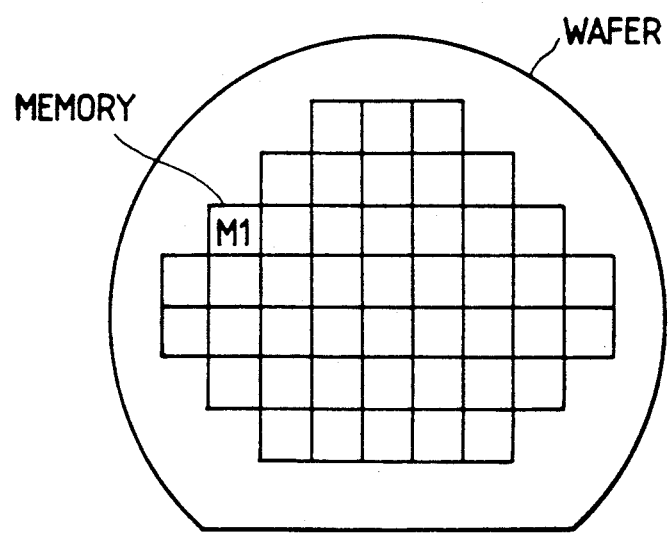
FIG. 15 shows the general arrangement of wafer scale integration according to the present invention.

FIG. 15 shows one example of wafer scale integration to which any of the embodiments 1, 2 and 3 respectively shown in FIGS. 1, 7 and 11 may be applied. A plurality of memories which are divided into blocks are formed on a wafer. One of these memories, for example, the memory M1, may correspond to the unit integrated circuit UC1 in FIG. 1, the unit memory integrated circuit UM0 in FIG. 7 or the unit memory MA in FIG. 11.

What is claimed is:

1. A semiconductor integrated circuit device comprising:
   a plurality of unit integrated circuits formed on the same wafer;
   connecting means provided between said unit integrated circuits to couple them to each other in a predetermined connecting direction; and
   bypass means provided inside each of said unit integrated circuits to couple together an input-side wiring coupled to an input part of the unit integrated circuit and an output-side wiring coupled to an output part thereof,
   wherein said bypass means is selectively brought into a transfer state when the corresponding unit integrated circuit judged to be defective so that unit integrated circuits adjacent to said corresponding unit integrated circuit judged to be defective are coupled to one another by said bypass means of said integrated circuit judged to be defective without changing said predetermined connecting direction.

2. A semiconductor integrated circuit device according to claim 1, wherein said connecting means are coupled together through said unit integrated circuits placed in a select state and said bypass means placed in a transfer state to constitute a series of buses.

3. A semiconductor integrated circuit device according to claim 2, wherein said connecting means are used to handle storage data input to and output from a memory cell array included in each of said unit integrated circuits, said input and output parts being coupled to said memory cell array.

4. A semiconductor integrated circuit device according to claim 3, further comprising:
   a first address bus and a control bus which are mutually coupled to said plurality of unit integrated circuits,
   wherein said first address bus is used to handle selecting signals for memory cells in each of said plurality of unit integrated circuits.

5. A semiconductor integrated circuit device according to claim 4, wherein said memory cell array comprises dynamic memory cells, and wherein an operation of refreshing said memory cells is conducted in a time-division manner among said plurality of unit integrated circuits.

6. A semiconductor integrated circuit device according to claim 1, wherein said bypass means is selectively brought into a transfer state when the corresponding unit integrated circuit is judged to be in a condition of being normal and in a non-select state.

7. A semiconductor integrated circuit device according to claim 4, further comprising a second address bus used to handle selecting signals for said plurality of unit integrated circuits.

8. A semiconductor integrated circuit device according to claim 7, wherein said control bus is used to handle a control signal for said bypass means.

9. A semiconductor integrated circuit device comprising:
   a plurality of unit integrated circuits formed in an array on the same wafer;
   first connecting means provided between a plurality of unit integrated circuits disposed along a first row of said array to couple them to each other in a direction of said first row;
   second connecting means provided between a plurality of unit integrated circuits disposed along a second row of said array to couple them to each other in a direction of said second row;
   first bypass means provided inside each of said unit integrated circuits disposed along said first row to couple together the first connecting means coupled to an input part of the unit integrated circuit and the first connecting means coupled to an output part thereof; and
   second bypass means provided inside each of said unit integrated circuits disposed along said second row to couple together the second connecting means coupled to an input part of the unit integrated circuit and the second connecting means coupled to an output part thereof,
   wherein said first bypass means is selectively brought into a transfer state when the corresponding unit integrated circuit disposed along said first row is judged to be defective so that unit integrated circuits adjacent to said corresponding unit integrated circuit judged to be defective in said first row are coupled to one another by said bypass means of said unit integrated circuit judged to be defective without changing said direction of said first row, and wherein said second bypass means is selectively brought into a transfer state when the corresponding unit integrated circuit disposed along said second row is judged to be defective so that unit integrated circuits adjacent to said corresponding unit integrated circuit judged to be defective in said second row are coupled to one another by said bypass means of said unit circuit judged to be defective without changing said direction of said second row.

10. A semiconductor integrated circuit device according to claim 9, wherein said first bypass means is selectively brought into a transfer state when the corresponding unit integrated circuit is judged to be in a condition of being normal and in a non-select state, and wherein said second bypass means is selectively brought into a transfer state when the corresponding unit integrated circuit is judged to be in condition of being normal and in a non-select state.

11. A semiconductor integrated circuit device according to claim 9, wherein said first connecting means are coupled together through said unit integrated circuits placed in a select state and said first bypass means placed in a transfer state to comprise a first bus formed along said first row, and wherein said second connecting means are coupled together through said unit integrated circuits placed in a select state and said second bypass means placed in a transfer state to comprise a second bus formed along said second row.

12. A semiconductor integrated circuit device according to claim 11, wherein each of said unit integrated circuits includes a memory cell array, said input and output parts being coupled to said memory cell array.

13. A semiconductor integrated circuit device according to claim 12, wherein said first bus is used to handle storage data input to and output from the memory cell arrays respectively included in a plurality of unit integrated circuits disposed along said first row, while said second bus is used to handle storage data input to and output from the memory cell arrays respectively included in a plurality of unit integrated circuits disposed along said second row.

14. A semiconductor memory device comprising:
 a plurality of unit memory integrated circuits each including a plurality of memory elements respectively located at predetermined addresses;
 first redundant elements provided in correspondence with said unit memory integrated circuits and capable of being allotted to desired addresses in the corresponding unit memory integrated circuit; and
 second redundant elements provided in correspondence with the addresses in said unit memory integrated circuits and capable of being allotted to the corresponding addresses in said unit memory integrated circuits;
 wherein said first redundant elements are provided in the corresponding unit memory integrated circuits, respectively, and are separate from said memory elements, and further wherein said second redundant elements are provided outside said unit memory integrated circuits.

15. A semiconductor memory device according to claim 14, wherein said second redundant elements are formed by one or more redundant memory integrated circuits having the same arrangement as that of said unit memory integrated circuits.

16. A semiconductor memory device according to claim 15, further comprising:
 a memory for storing device codes of said unit memory integrated circuits allotted respectively to the addresses in said redundant memory integrated circuit(s); and
 a memory control circuit for making a comparison between a device code supplied externally and a device code read out from the corresponding address in said memory and selecting the corresponding unit memory integrated circuit or redundant memory integrated circuit.

17. A semiconductor memory device according to claim 16, wherein said unit memory integrated circuits, redundant memory integrated circuit(s) and memory control circuit are formed on the same wafer.

18. A semiconductor integrated circuit device comprising:
 a first unit integrated circuit including a first internal circuit and a first output buffer which has a first output circuit and a second output circuit, wherein an output terminal of said first output circuit is coupled to an input terminal of said second output circuit and an input terminal of said first output circuit is coupled to said first internal circuit;
 a second unit integrated circuit including a second internal circuit and a second output buffer which has a third output circuit and a fourth output circuit, wherein an output terminal of said third output circuit is coupled to an input terminal of said fourth output circuit and an input terminal of said third output circuit is coupled to said second internal circuit;
 a drive means for supplying a signal to a line;
 a first connecting line provided between said output terminal of said first output circuit and said input terminal of said fourth output circuit; and
 a second connecting line provided between an output terminal of said fourth output circuit and an input terminal of said drive means,
 wherein said first unit integrated circuit, said second unit integrated circuit and said drive means are formed on a semiconductor wafer.

19. A semiconductor integrated circuit device according to claim 18, further comprising:
 a third unit integrated circuit including a third internal circuit and a third output buffer which has a fifth output circuit and a sixth output circuit, wherein an output terminal of said fifth output circuit is coupled to an input terminal of said sixth output circuit an input terminal of said fifth output circuit is coupled to said third internal circuit;
 a fourth unit integrated circuit including a fourth internal circuit and a fourth output buffer which has a seventh output circuit and an eighth output circuit, wherein an output terminal of said seventh output circuit is coupled to an input terminal of said eighth output circuit and input terminal of said seventh output circuit is coupled to said fourth internal circuit;
 a third connecting line provided between said output terminal of said fifth output circuit and said input terminal of said eighth output circuit; and
 a fourth connecting line provided between said output terminal of said eighth output circuit and said input terminal of said drive means,
 wherein said third unit integrated circuit and said fourth unit integrated circuit are formed on said semiconductor wafer.

20. A semiconductor integrated circuit device according to claim 19, further comprising:
 a fifth unit integrated circuit including a fifth internal circuit and a fifth output buffer which has a ninth output circuit and a tenth output circuit, wherein an output terminal of said ninth output circuit is coupled to an input terminal of said tenth output circuit and an input terminal of said ninth output circuit is coupled to said fifth internal circuit; and
 a fifth connecting line provided between said input terminal of said ninth output circuit and said input terminal of said first output circuit,
 wherein said fifth unit integrated circuit is formed on said semiconductor wafer.

21. A semiconductor integrated circuit device according to claim 20, further comprising:
 a sixth unit integrated circuit including a sixth internal circuit and a sixth output buffer which has an eleventh output circuit and a twelfth output circuit, wherein an output terminal of said eleventh output circuit and an input terminal of said eleventh output circuit is coupled to said sixth internal circuit; and a sixth connecting line provided between said input terminal of said eleventh output circuit and said input terminal of said third output circuit, wherein said sixth unit integrated circuit is formed on said semiconductor wafer.

* * * * *